US008681571B2

(12) United States Patent
Fox et al.

(10) Patent No.: US 8,681,571 B2
(45) Date of Patent: Mar. 25, 2014

(54) TRAINING A MEMORY CONTROLLER AND A MEMORY DEVICE USING MULTIPLE READ AND WRITE OPERATIONS

(75) Inventors: Benjamin A. Fox, Rochester, MN (US); William P. Hovis, Rochester, MN (US); Thomas W. Liang, Rochester, MN (US); Paul W. Rudrud, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 368 days.

(21) Appl. No.: 12/815,844

(22) Filed: Jun. 15, 2010

(65) Prior Publication Data

US 2011/0307671 A1    Dec. 15, 2011

(51) Int. Cl.
*G11C 7/00*    (2006.01)

(52) U.S. Cl.
USPC ............. 365/189.09; 365/189.11; 365/233.13

(58) Field of Classification Search
USPC ........................ 326/30; 365/189.09, 189.11
See application file for complete search history.

(56) References Cited

U.S. PATENT DOCUMENTS

| | | | |
|---|---|---|---|
| 6,049,221 A | 4/2000 | Ishibashi et al. | |
| 6,130,836 A | 10/2000 | Matsubara et al. | |
| 6,330,194 B1 | 12/2001 | Thomann et al. | |
| 6,414,525 B2 | 7/2002 | Urakawa | |
| 6,445,316 B1 | 9/2002 | Hsu et al. | |
| 6,463,586 B1 | 10/2002 | Jerding | |
| 6,476,825 B1 | 11/2002 | Croÿ et al. | |
| 6,509,908 B1 | 1/2003 | Croy et al. | |
| 6,639,423 B2 | 10/2003 | Martin et al. | |
| 6,762,614 B2 | 7/2004 | Rearick et al. | |
| 6,807,650 B2 | 10/2004 | Lamb et al. | |
| 6,828,992 B1 | 12/2004 | Freeman et al. | |
| 6,885,959 B2 | 4/2005 | Salmon et al. | |
| 6,889,191 B2 | 5/2005 | Rodriguez et al. | |
| 6,958,942 B2 | 10/2005 | Chang | |
| 6,978,310 B1 | 12/2005 | Rodriguez et al. | |
| 7,093,198 B1 | 8/2006 | Paatero et al. | |
| 7,184,024 B2 | 2/2007 | Eftekhari | |
| 7,362,622 B2 | 4/2008 | Braun et al. | |
| 7,411,407 B2 | 8/2008 | Rearick et al. | |
| 7,439,761 B2 | 10/2008 | Mayer et al. | |
| 7,489,160 B2 * | 2/2009 | Kimura | 326/30 |
| 7,514,954 B2 | 4/2009 | Kim et al. | |
| 7,515,487 B2 | 4/2009 | Seo et al. | |
| 7,593,272 B2 | 9/2009 | Doyle et al. | |

(Continued)

OTHER PUBLICATIONS

U.S. Appl. No. 12/361,719, entitled "Setting Controller VREF in a Memory Controller and Memory Device Interface in a Communication Bus," filed Jan. 29, 2009, Benjamin A. Fox et al.

(Continued)

*Primary Examiner* — Hoai V Ho
*Assistant Examiner* — Tri Hoang
(74) *Attorney, Agent, or Firm* — Toler Law Group

(57) ABSTRACT

Systems and methods to set a voltage value associated with a communication bus that includes memory controller coupled to a memory device are disclosed. A particular method may include performing a first calibration operation associated with first data written from a memory controller to a memory device. A second calibration operation may be associated with second data read at the memory controller from the memory device. The operating parameter may be set based on a result of at least one of the first and the second calibration operations at the memory device or the memory controller.

20 Claims, 17 Drawing Sheets

(56) References Cited

U.S. PATENT DOCUMENTS

| | | | |
|---|---|---|---|
| 7,710,144 B2 | 5/2010 | Dreps et al. | |
| 2002/0149972 A1 | 10/2002 | Lamb et al. | |
| 2002/0180807 A1 | 12/2002 | Dubil et al. | |
| 2003/0095156 A1 | 5/2003 | Klein et al. | |
| 2004/0040039 A1 | 2/2004 | Bernier | |
| 2008/0272800 A1 | 11/2008 | Haig et al. | |
| 2010/0188908 A1 | 7/2010 | Fox et al. | |
| 2010/0188917 A1 | 7/2010 | Fox et al. | |
| 2010/0188919 A1 | 7/2010 | Fox et al. | |
| 2010/0192000 A1 | 7/2010 | Fox et al. | |
| 2012/0182044 A1* | 7/2012 | Oh | 326/30 |
| 2012/0224436 A1 | 9/2012 | Fox et al. | |

OTHER PUBLICATIONS

U.S. Appl. No. 12/361,836, entitled "Setting Controller Termination in a Memory Controller and Memory Device Interface in a Communication Bus," filed Jan. 29, 2009, Benjamin A. Fox et al.

U.S. Appl. No. 12/361,976, entitled "Calibration of Memory Driver With Offset in a Memory Controller and Memory Device Interface in a Communication Bus," filed Jan. 29, 2009, Benjamin A. Fox et al.

U.S. Appl. No. 12/361,577, entitled "Setting Memory Controller Driver to Memory Device Termination Value in a Communication Bus," filed Jan. 29, 2009, Benjamin A. Fox et al.

U.S. Appl. No. 12/361,592, entitled "Setting Memory Device VREF in a Memory Controller and Memory Device Interface in a Communication Bus," filed Jan. 29, 2009, Benjamin A. Fox et al.

U.S. Appl. No. 12/361,602, entitled "Setting Memory Device Termination in a Memory Device and Memory Controller Interface in a Communication Bus," filed Jan. 29, 2009.

Entitled "Setting a Reference Voltage in a Memory Controller Trained to a Memory Device" filed Jun. 15, 2010, Benjamin A. Fox, et al.

U.S. Appl. No. 12/815,739; Non-Final Office Action dated Feb. 7, 2012; 10 pages.

U.S. Appl. No. 12/815,739; Notice of Allowance dated Jun. 7, 2012; 5 pages.

U.S. Appl. No. 13/472,891; Non-Final Office Action dated Mar. 11, 2013; 8 pages.

Jedec Standard, "POD18—1.8 V Pseudo Open Drain I/O: JESD8-19", Dec. 2006, JEDEC Solid State Technology Association, Arlington, VA, pp. 1-8.

U.S. Appl. No. 12/361,719; Notice of Allowance dated Sep. 19, 2011; 9 pages.

U.S. Appl. No. 12/361,836; Non-Final Office Action dated Jun. 2, 2011; 7 pages.

U.S. Appl. No. 12/361,836; Notice of Allowance dated Sep. 29, 2011; 10 pages.

U.S. Appl. No. 12/361,836; Supplemental Notice of Allowability dated Nov. 8, 2011; 2 pages.

U.S. Appl. No. 12/361,976; Notice of Allowance dated Jul. 30, 2010; 6 pages.

U.S. Appl. No. 12/361,577; Non-Final Office Action dated Oct. 13, 2010; 9 pages.

U.S. Appl. No. 12/361,577; Notice of Allowance dated Mar. 22, 2011; 9 pages.

U.S. Appl. No. 12/361,592; Notice of Allowance dated Feb. 25, 2011; 8 pages.

U.S. Appl. No. 12/361,602; Notice of Allowance dated Mar. 3, 2011; 8 pages.

U.S. Appl. No. 13/472,891; Final Office Action dated Jul. 31, 2013; 6 pages.

* cited by examiner

TRAINING A MEMORY CONTROLLER AND A MEMORY DEVICE USING MULTIPLE READ AND WRITE OPERATIONS

I. FIELD OF THE DISCLOSURE

The present disclosure relates to training impedance values associated with a memory device coupled to a memory controller.

II. BACKGROUND

In a memory bus, the impedances of a memory device and a memory controller can be trained against each other. The training may enable the memory bus to detect a data eye of a signal, such as a signal communicated over a link coupling the memory device to the memory controller. The data eye may include a point on the signal that (when located and sampled) may be used to identify an associated bit as being either a logical one or a zero. Training may include adjusting an operating parameter of the memory controller or the memory device. An illustrative operating parameter may include a voltage level associated with the signal.

Mismatching impedances of the memory device and the memory controller may reduce a width of the data eye, or timing margin, and compromise data accuracy.

III. SUMMARY OF THE DISCLOSURE

In a particular embodiment, a method to set a voltage value associated with a communication bus that includes a memory controller coupled to a memory device is disclosed. The method may include performing a first calibration operation associated with first data written from a memory controller to a memory device. A second calibration operation may be associated with second data read at the memory controller from the memory device. The operating parameter may be set based on a result of at least one of the first and the second calibration operations at the memory device or the memory controller.

In another embodiment, a method includes performing a first calibration operation associated with first data read at the memory controller from the memory device. A second calibration operation may be associated with second data read at the memory controller from the memory device. The operating parameter may be set based on a result of at least one of the first and the second calibration operations at the memory device or the memory controller.

In another embodiment, a method includes performing a first calibration operation associated with first data written from a memory controller to a memory device. A second calibration operation may be associated with second data written from a memory controller to a memory device. The operating parameter may be set based on a result of at least one of the first and the second calibration operations at the memory device or the memory controller.

Signal errors may be reduced and the speed at which the communication bus executes may increase. The automatic adjustment of operating parameters may reduce impedance mismatches and yield improvements in timing margins. Data may be read and compared to known data at startup and during real time. System operation may remain uninterrupted while the operating parameters are selectively updated. The updates may increase system speed and accuracy.

Features that characterize embodiments are set forth in the claims annexed hereto and forming a further part hereof. However, for a better understanding of embodiments, and of the advantages and objectives attained through their use, reference should be made to the Drawings and to the accompanying descriptive matter.

IV. BRIEF DESCRIPTION OF THE DRAWINGS

V. DETAILED DESCRIPTION

A memory device and a memory controller linked via a data net may be trained using a combination of operations that include at least one of a read operation and a write operation. A write operation may include data (e.g., a one or a zero) being communicated via the data net from the driver of the memory controller to the memory device. A read operation may include data (e.g., a one or a zero) being received at the memory controller from a driver of the memory device via the data net. The training may include direct or alternating current and may use real time, functional data. Functional or deterministic data may be compared to test data to determine what, if any, adjustments to make to operating parameters of at least one of the memory device and the memory controller. The operating parameters may be automatically adjusted during operations. Signal errors and impedance mismatches may be reduced, and execution speed may be increased. The operating parameters may be managed to increase the timing margin.

Figure 1:
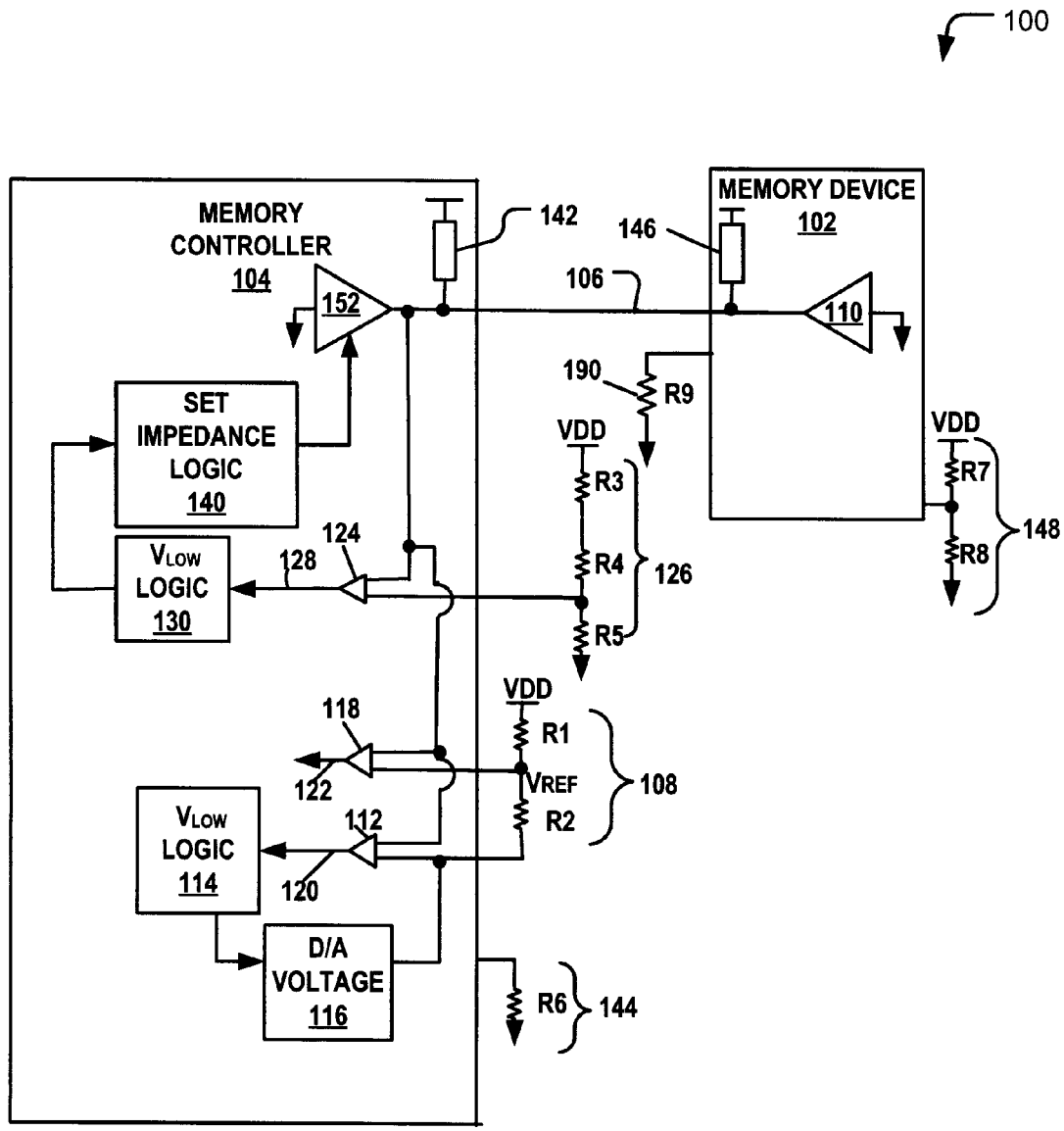
FIG. 1 is a block diagram of a first embodiment of a system configured to train a memory device and a memory controller using a combination of a write operation and a read operation.

FIG. 1 shows a first embodiment of a system 100 configured to train a memory device 102 and a memory controller 104 using a combination of a write operation and a read operation. For instance, the impedance of a driver 152 of the memory controller 104 may be set using a write operation. Additionally, a reference voltage of a first resistor arrangement 108 coupled to the memory controller 104 may be set using a read operation. The system 100 may use a single test path (e.g., a low voltage test path) in each read and write operation. An embodiment of the system 100 may comprise a communications bus.

The memory device 102 may be coupled to the memory controller 104 via a data net 106. Training may include adjusting one more operating parameters of the memory controller 104. For example, the training may include setting the reference voltage ($V_{ref}$) associated with the first resistor arrangement 108. A low voltage value used to set the reference voltage may be automatically determined and updated. The reference voltage may be set before and updated during operation. In another example, an operating parameter may include an impedance of the driver 152 of the memory controller 104. The impedance of the driver 152 may be set and adjusted to train the memory controller 104.

The data net 106 may couple a driver 110 of the memory device 102 to an input port of a comparator 112 of the memory controller 104. The resistor arrangement 108 may provide a low voltage value to a second input of the comparator 112. The resistor arrangement 108 may include a first resistor R1 associated with the high voltage value. The resistor arrangement 108 may further include a second resistor R2 associated with the low voltage value. The output of the comparator 112 may comprise a first test path 120 coupled to $V_{low}$ logic 114. The $V_{low}$ logic 114 may be configured to determine a low voltage value. The $V_{low}$ logic 114 may be coupled to a digital-to-analog voltage (D/A) voltage device 116. The $V_{low}$ logic 114 may be configured to instruct the D/A voltage device 116 to selectively increment or decrement the low voltage value at the first resistor arrangement 108.

The data net 106 may additionally be coupled to a first input of a comparator 118. The resistor arrangement 108 may provide the reference voltage to a second input of the comparator 118. The output of the comparator 118 may comprise a functional path 122 associated with a functional device (not shown). During a read operation, the data of the functional path 122 may be compared to the data of the first test path 120. A result of the comparison may be used to set or adjust the low voltage value.

For instance, the correctness of the test path data may be determined based on data of the functional path 122. A percentage of the instances when correct data (or incorrect data) is read in the first test path 120 may be determined by comparing the test data with the functional data. For example, the data of the functional path 122 may be used to determine if a one or a zero of the first test path 120 correctly corresponds to a one or a zero of the functional path 122. At a point when the incorrect data of the test path 120 switches (i.e., from a zero to a one, or from a one to a zero), the voltage value may be set correctly. A predetermined range, ratio, set point, or other criteria may be specified. For instance, the low voltage value may be too low until some percentage of the data of the first test path 120 matches data of the functional path 122.

During a write operation, a comparator 124 may receive a data signal at a first input coupled to the data net 106. A second input of the comparator 124 may be coupled to a second resistor arrangement 126. The second resistor arrangement 126 may include multiple resistors R3, R4, and R5.

The output of the comparator 124 may comprise a second test path 128 coupled to $V_{low}$ logic 130 configured to determine a low voltage value. The $V_{low}$ logic 130 may be coupled to set impedance logic 140. The $V_{low}$ logic 130 may be configured to instruct the set impedance logic 140 to pull down the impedance of the driver 152. The impedance of the driver 152 may be adjusted to train the memory controller 104 during a write operation. For example, impedance of the driver 152 may be adjusted when the data of the second test path 128 falls outside of a predetermined range, ratio, set point, or other criteria when compared to corresponding data of the functional path 122.

As shown in FIG. 1, the memory controller 104 may be coupled to a third resistor arrangement 144 that includes a resistor R6. An embodiment may apply current to the third resistor arrangement 144 to affect impedances associated with a termination device 142 and the driver 152. The memory device 102 may be coupled to a fourth resistor arrangement 148 that includes resistors R7 and R8 and to a fifth resistor arrangement 190 that includes resistor R9. The fourth resistor arrangement 148 may be configured to provide a reference voltage to the memory device 102. A voltage at the fifth resistor arrangement 190 may affect impedances of the driver 110 and a termination device 146 of the memory device 102. The termination devices 142, 146 may each be associated with a load impedance to match line impedance and reduce signal reflection along the data net 106.

An illustrative memory device 102 may include a Dynamic Random Access Memory (DRAM) memory device, such as a Graphics Double Data Rate (GDDR) DRAM. The memory controller 104 may be located within any type of computer system including, but not limited to, a desktop computer, a server, a laptop, a handheld device, a tablet personal computer, a set-top box, or another type of computer system that utilizes system memory. Within the computer system, the memory controller 104 may be located in a chipset, in one or more processors coupled to the chipset, or in a discrete component coupled to the system memory. The data net 106 may include one or more links configured to transmit data between two components within a computer system.

Figure 2:
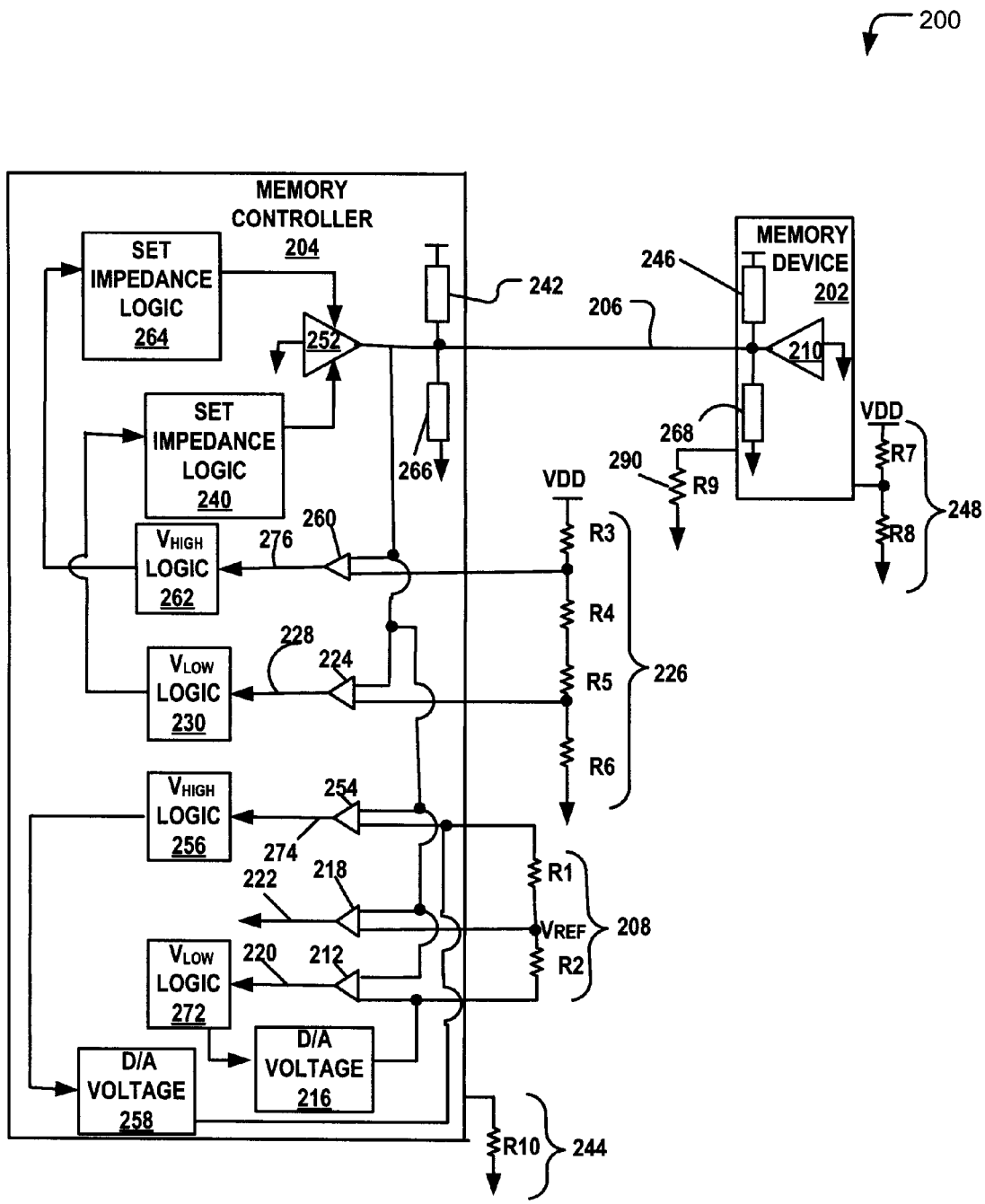
FIG. 2 is a block diagram of a second embodiment of a system configured to train a memory device and a memory controller using a combination of a write operation and a read operation.

FIG. 2 shows a second embodiment of a system 200 configured to train a memory device 202 and a memory controller 204 using a combination of a write operation and a read operation. For instance, the impedance of a driver 252 of the memory controller 204 may be set using a write operation, and a reference voltage of a first resistor arrangement 208 may be set using a read operation. The system 200 may use both high and low voltage test paths in each read and write operation.

The memory device 202 may be coupled to the memory controller 204 via a data net 206. Training may include adjusting one more operating parameters of the memory controller 204. For example, the training may include setting a reference voltage ($V_{ref}$) associated with the first resistor arrangement 208. A low and a high voltage value may be used to set the reference voltage may be automatically determined and updated. The reference voltage may be set before and updated during operation. In another example, an operating parameter may include an impedance of the driver 252 of the memory controller 204. The impedance of the driver 252 may be set and adjusted to train the memory controller 204.

The data net 206 may couple a driver 210 of the memory device 202 to an input port of a comparator 212 of the memory controller 204. A second input of the comparator 212 may be coupled to the first resistor arrangement 208. The first resistor arrangement 208 may provide a low voltage value to the second input of the comparator 212. The resistor arrangement 208 may include a first resistor R1 associated with the high voltage value. The resistor arrangement 208 may further include a second resistor R2 associated with the low voltage value. The output of the comparator 212 may comprise a low test path 220 coupled to a $V_{low}$ logic 272 configured to determine a low voltage value. The $V_{low}$ logic 272 may be coupled to a D/A voltage device 216. The $V_{low}$ logic 272 may be configured to instruct the D/A voltage device 216 to selectively increment or decrement the low voltage value at the first resistor arrangement 208.

The data net 206 may additionally be coupled to an input port of a comparator 254 of the memory controller 204. A second input of the comparator 254 may be coupled to the first resistor arrangement 208. The first resistor arrangement 208 may provide a high voltage value to the second input of the comparator 254. The output of the comparator 254 may comprise a high test path 274 coupled to a $V_{high}$ logic 256 configured to determine a high voltage value. The $V_{high}$ logic 256 may be coupled to a D/A voltage device 258. The $V_{high}$ logic 256 may be configured to instruct the D/A voltage device 258 to selectively increment or decrement the high voltage value at the first resistor arrangement 208.

The data net 206 may additionally be coupled to a first input of a comparator 218. The resistor arrangement 208 may provide the reference voltage to a second input of the comparator 218. The output of the comparator 218 may comprise a functional path 222 associated with a functional device (not shown). During a read operation, the data of the functional path 222 may be compared to the data of the low test path 220 and the high test path 274. Results of the comparison may be used to set or otherwise adjust at least one of the high and low voltage values. For example, the correctness of the high and low test path data may be determined based on data of the functional path 222. A percentage of the instances when correct data (or incorrect data) is read may be determined by comparing the test data with the functional data. A predetermined range, ratio, set point, or other criteria may be specified, as described herein. As with other embodiments described herein, the test data may be monitored over several cycles.

For instance, the correctness of the test path data may be determined based on data of the functional path 222. A percentage of the instances when correct data (or incorrect data) is read in the test data path 220 may be determined by comparing the test data with the functional data. For example, the data of the functional path 222 may be used to determine if a one or a zero of the test path 220 correctly corresponds to a one or zero of the functional path. At a point when the incorrect data of the test path 220 switches (i.e., from a zero to a one, or from a one to a zero), the voltage value may be set correctly. A predetermined range, ratio, set point, or other criteria may be specified. For instance, the low voltage value may be too low until some percentage of the data of the test path 220 matches data of the functional path 222.

During a write operation, a comparator 224 may receive a data signal at a first input coupled to the data net 206. A second input of the comparator 224 may be coupled to a second resistor arrangement 226. The second resistor arrangement 226 may include resistors R3, R4, R5, and R6. The output of the comparator 224 may comprise a low test path 228 coupled to a $V_{low}$ logic 230 configured to determine a low voltage value. The $V_{low}$ logic 230 may be coupled to set impedance logic 240. The $V_{low}$ logic 230 may be configured to instruct the set impedance logic 240 to pull down the impedance of the driver 252. The impedance of the driver 252 may be adjusted to train the memory controller 204 during a write operation. For example, impedance of the driver 252 may be adjusted when the data of the low test path 228 falls outside of a predetermined range, ratio, set point, or other criteria when compared to corresponding data of the functional path 222.

A comparator 260 may receive a data signal at a first input coupled to the data net 206. A second input of the comparator 260 may be coupled to the second resistor arrangement 226. The output of the comparator 260 may comprise a high test path 276 coupled to a $V_{high}$ logic 262 configured to determine a high voltage value. The $V_{high}$ logic 262 may be coupled to set impedance logic 264. The $V_{high}$ logic 262 may be configured to instruct the set impedance logic 264 to pull up the impedance of the driver 252. The impedance of the driver 252 may be adjusted to train the memory controller 204 during a write operation. For instance, impedance of the driver 252 may be adjusted when the data of the high test path 276 falls outside of a predetermined range, ratio, set point, or other criteria when compared to corresponding data of the functional path 222.

As shown in FIG. 2, the memory device 202 may be coupled to a third resistor arrangement 248 that includes resistors R7 and R8 and to a fourth resistor arrangement 290 that includes resistor R9. The third resistor arrangement 148 may be configured to provide a reference voltage to the memory device 102. A voltage at the fourth resistor arrangement 290 may affect impedances of the driver 110 and termination devices 246, 248 of the memory device 102. The memory controller 204 may include termination devices 242, 266 and may be coupled to a fifth resistor arrangement 244. The termination devices 242, 246, 248, and 266 may each be associated with a load impedance to match line impedance and reduce signal reflection along the data net 206. The fifth resistor arrangement 244 may be configured to affect the impedances of the termination devices 242, 266 and the driver 252.

FIGS. 1 and 2 thus show embodiments of systems 100, 200 configured to train voltage values between a memory controller and a memory device using a combination of a read and a write operation. For example, the impedances of the drivers 152, 252 may be set using a write operation, and the reference voltages of the resistor arrangements 108, 208 may be set using a read operation. The system 100 may use a single test path (e.g., a low voltage test path) in each read and write operation. The system 200 may use both high and low voltage test paths in each read and write operation. Both systems 100, 200 may facilitate increased data accuracy, timing margins, and processing speed.

Figure 3:
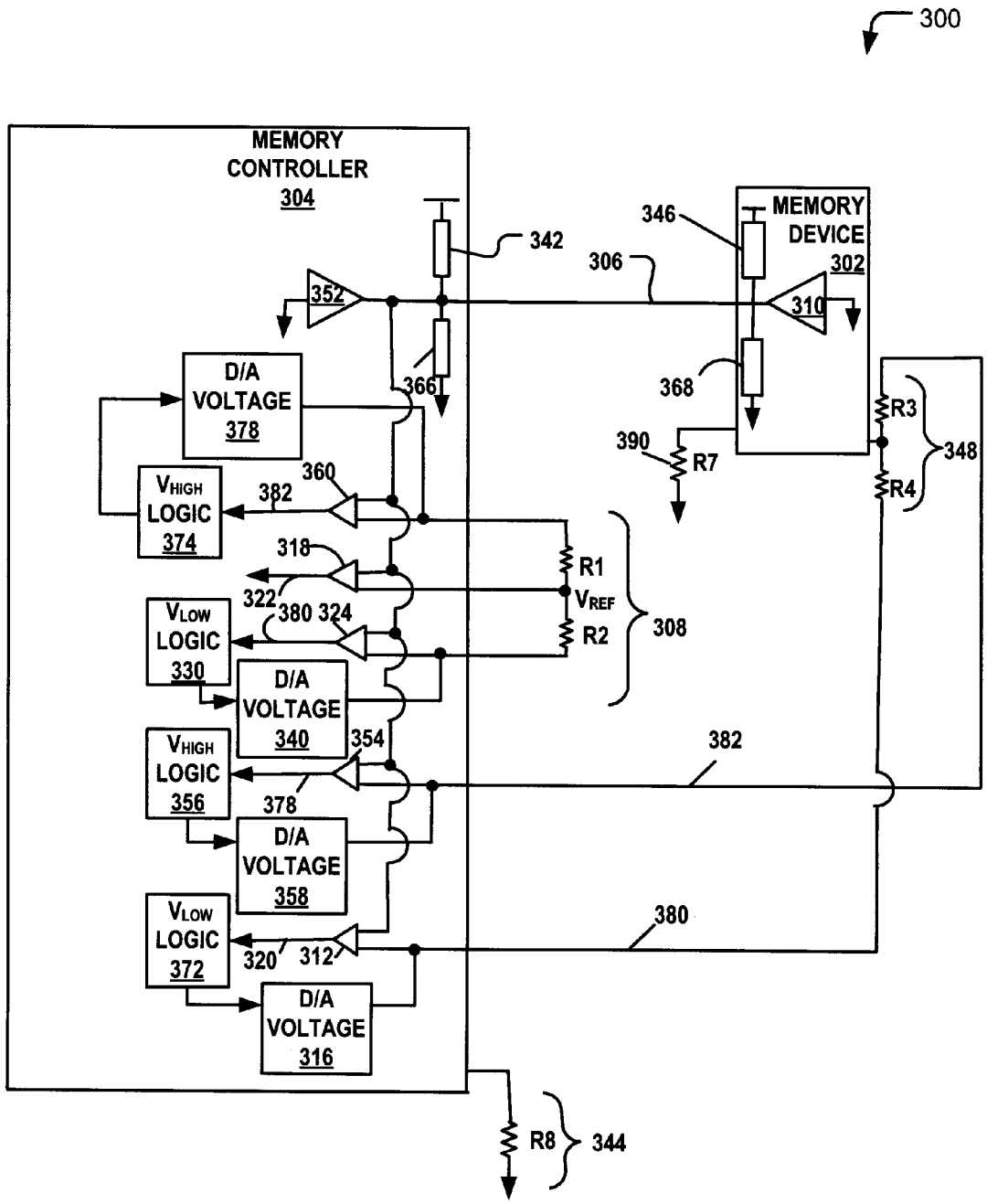
FIG. 3 is a block diagram of a third embodiment of a system configured to train a memory device and a memory controller using a combination of a write operation and a read operation.

FIG. 3 shows a third embodiment of a system 300 configured to train a memory device 302 and a memory controller 304 using a combination of a write operation and a read operation. For instance, a reference voltage 348 of the memory device 302 may be set using a write operation, and a reference voltage of memory controller 304 may be set using a read operation. The system 300 may use both high and low voltage test paths in each read and write operation. The system 300 may comprise a communications bus.

The memory device 302 may be coupled to the memory controller 304 via a data net 306. Training may include adjusting one more operating parameters of the memory device 302 and the memory controller 304. For example, the training may include setting a reference voltage ($V_{ref}$) associated with a first resistor arrangement 308 coupled to the memory controller 304. A low and a high voltage value may be used to set the reference voltage may be automatically determined and updated. The reference voltage may be set before and updated during operation. In another example, an operating parameter may include a reference voltage of the memory device 302. The reference voltage may be set by adjusting high and low voltage values associated with a second resistor arrangement 348.

The data net 306 may couple a driver 310 of the memory device 302 to an input port of a comparator 324 of the memory controller 304. The first resistor arrangement 308 may provide a low voltage value to the second input of the comparator 324. The resistor arrangement 308 may include a first resistor R1 associated with the high voltage value. The resistor arrangement 308 may further include a second resistor R2 associated with the low voltage value. The output of the comparator 324 may comprise a low test path 380 coupled to a $V_{low}$ logic 330 configured to determine a low voltage value. The $V_{low}$ logic 330 may be coupled to a D/A voltage device 340. The $V_{low}$ logic 330 may be configured to instruct the D/A voltage device 340 to selectively increment or decrement the low voltage value at the first resistor arrangement 308.

The data net 306 may additionally be coupled to an input port of a comparator 360 of the memory controller 304. A second input of the comparator 360 may be coupled to the first resistor arrangement 308. The first resistor arrangement 308 may provide a high voltage value to the second input of the comparator 360. The output of the comparator 360 may comprise a high test path 382 coupled to a $V_{high}$ logic 374 configured to determine a high voltage value. The $V_{high}$ logic 374 may be coupled to a D/A voltage device 378. The $V_{high}$ logic 374 may be configured to instruct the D/A voltage device 378 to selectively increment or decrement the high voltage value at the first resistor arrangement 308 during a read operation.

The data net 306 may additionally be coupled to a first input of a comparator 318. The resistor arrangement 308 may provide the reference voltage to a second input of the comparator 318. The output of the comparator 318 may comprise a functional path 322 associated with a functional device (not shown). During a read operation, the data of the functional path 322 may be compared to the data of the low test path 380 and the high test path 382. Results of the comparison may be used to set or adjust at least one of the high and low voltage values. For instance, the correctness of the high and low test path data may be determined based on data of the functional path 322. A percentage of the instances when correct data (or incorrect data) is read may be determined by comparing the test data with the functional data. A predetermined range, ratio, set point, or other criteria may be specified, as described herein.

During a write operation, a comparator 312 may receive a data signal at a first input coupled to the data net 306. A second input of the comparator 312 may be coupled to a low voltage portion of a second resistor arrangement 348. The second resistor arrangement 348 may include resistors R3 and R4 and may provide a reference voltage to the memory device 302. The output of the comparator 312 may comprise a low test path 320 coupled to a $V_{low}$ logic 372 configured to determine a low voltage value. The $V_{low}$ logic 372 may be coupled to a D/A voltage device 316. The $V_{high}$ logic 372 may be configured to instruct the D/A voltage device 316 to selectively increment or decrement the low voltage value at the second resistor arrangement 348 during a write operation. For example, the low voltage value may be adjusted when the data of the low test path 320 falls outside of a predetermined range, ratio, set point, or other criteria when compared to corresponding data of the functional path 322.

A comparator 354 may receive a data signal at a first input coupled to the data net 306. A second input of the comparator 354 may be coupled to a high voltage portion of the second resistor arrangement 348. The output of the comparator 354 may comprise a high test path 378 coupled to a $V_{high}$ logic 356 configured to determine a high voltage value. The $V_{high}$ logic 356 may be coupled to a D/A voltage device 358. The $V_{high}$ logic 356 may be configured to instruct the D/A voltage device 358 to selectively increment or decrement the high voltage value at the second resistor arrangement 348 during a write operation. For example, the high voltage value may be adjusted when the data of the high test path 378 falls outside of a predetermined range, ratio, set point, or other criteria when compared to corresponding data of the functional path 322.

As shown in FIG. 3, the memory controller 304 may include a termination device 342 and a termination device 366. A third resistor arrangement 344 that includes R8 may be configured to set impedances associated with the termination devices 342, 366 and the driver 352. The memory device 302 may include a termination device 346 and a termination device 368. A fourth resistor arrangement 344 that includes R7 may be configured to set impedances associated with the termination devices 346, 368 and the driver 310. The termination devices 342, 346, 366, and 368 may each be associated with a load impedance to match line impedance and reduce signal reflection along the data net 306.

The system 300 may train voltage values between the memory controller 304 and the memory device 302 using a combination of a read and a write operation. For instance, the reference voltage associated with the memory controller 304 may be set using a read operation, and the reference voltage associate with the memory device 302 may be set using a write operation. The adjustment of the high and low voltage values may reduce impedance mismatches by adjusting the reference voltage to yield improvements in timing margins.

Figure 4:
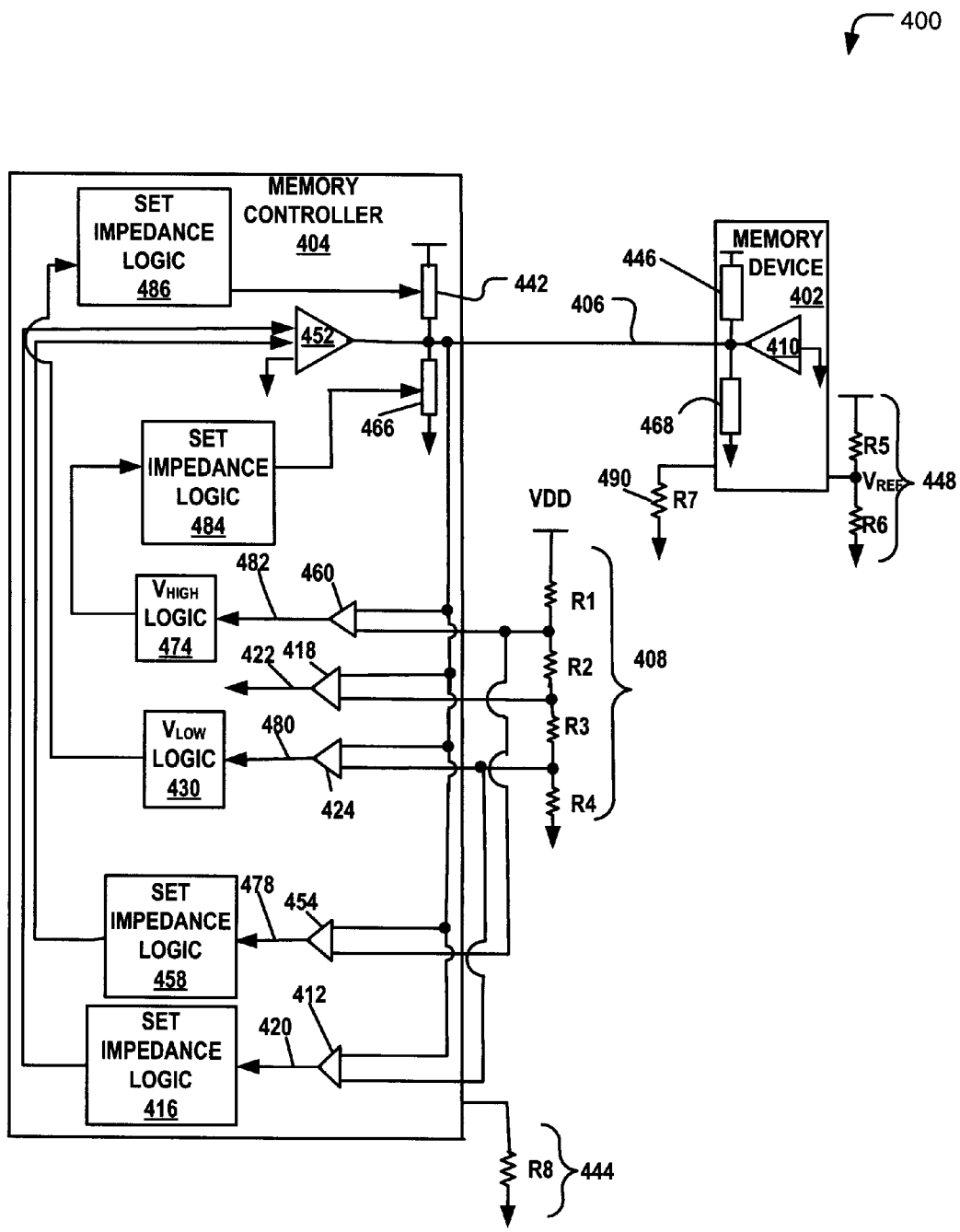
FIG. 4 is a block diagram of a fourth embodiment of a system configured to train a memory device and a memory controller using a combination of a write operation and a read operation.

FIG. 4 shows a fourth embodiment of a system 400 configured to train a memory device 402 and a memory controller 404 using a combination of a write operation and a read operation. For example, an impedance of a driver 452 of the memory controller 404 may be set using a write operation, and impedances of termination devices 442, 466 may be set using a read operation. The system 400 may use both high and low voltage test paths in each read and write operation. The system 400 may comprise a communications bus.

The memory device 402 may be coupled to the memory controller 404 via a data net 406. Training may include adjusting one more operating parameters of the memory controller 404. For instance, the training may include setting a pull up impedance at the termination device 442 and setting a pull down impedance at the termination device 466. In another example, an operating parameter may include an impedance of the driver 452 of the memory controller 404. The impedance of the driver 452 may be set and adjusted to train the memory controller 404.

The data net 406 may couple a driver 410 of the memory device 402 to an input port of a comparator 424 of the memory controller 404. A second input of the comparator 424 may be coupled to a first resistor arrangement 408. The first resistor arrangement 408 may include multiple resistors R1, R2, R3, and R4. The first resistor arrangement 408 may provide a low voltage value to the second input of the comparator 424. The output of the comparator 424 may comprise a low test path 480 coupled to a $V_{low}$ logic 430 configured to determine a low voltage value. The $V_{low}$ logic 430 may be coupled to set impedance logic 486. The set impedance logic 486 may be configured to pull up the impedance at the termination device 442.

The data net 406 may additionally be coupled to an input port of a comparator 460 of the memory controller 404. A second input of the comparator 460 may be coupled to the first resistor arrangement 408. The first resistor arrangement 408 may provide a high voltage value to the second input of the comparator 460. The output of the comparator 460 may comprise a high test path 482 coupled to a $V_{high}$ logic 474 configured to determine a high voltage value. The $V_{high}$ logic 474 may be coupled to set impedance logic 484. The set impedance logic 484 may be configured to pull down the impedance at the termination device 466.

The data net 406 may additionally be coupled to a first input of a comparator 418. The resistor arrangement 408 may provide a reference voltage to a second input of the comparator 418. The output of the comparator 418 may comprise a functional path 422 associated with a functional device (not shown). During a read operation, the data of the functional path 422 may be compared to the data of the low test path 480 and the high test path 482. Results of the comparison may be used to set or adjust at least one of the impedances at the termination devices 442, 466. For example, the correctness of the high and low test path data may be determined based on data of the functional path 422. A percentage of the instances when correct data (or incorrect data) is read may be determined by comparing the test data with the functional data. A predetermined range, ratio, set point, or other criteria may be specified, as described herein.

During a write operation, a comparator 412 may receive a data signal at a first input coupled to the data net 406. A second input of the comparator 412 may be coupled to the first resistor arrangement 408. The output of the comparator 412 may comprise a low test path 420 coupled to set impedance logic 416. The set impedance logic 416 may pull down the impedance of the driver 452. The impedance of the driver 452 may thus be adjusted to train the memory controller 404 during a write operation. For instance, impedance of the driver 452 may be adjusted when the data of the low test path 420 falls outside of a predetermined range, ratio, set point, or other criteria when compared to corresponding data of the functional path 422.

A comparator 454 may receive a data signal at a first input coupled to the data net 406. A second input of the comparator 454 may be coupled to the first resistor arrangement 408. The output of the comparator 454 may comprise a high test path 478 coupled to set impedance logic 458. The set impedance logic 458 may pull up the impedance of the driver 452. The impedance of the driver 452 may thus be adjusted to train the memory controller 404 during a write operation. For example, impedance of the driver 452 may be adjusted when the data of the high test path 478 falls outside of a predetermined range, ratio, set point, or other criteria when compared to corresponding data of the functional path 422.

As shown in FIG. 4, the memory device 402 may be coupled to a second resistor arrangement 448 that includes resistors R5, R6 and a third resistor arrangement 490 that includes resistor R7. The second resistor arrangement 448 may be configured to provide a reference voltage to the memory device 402. A voltage at the third resistor arrangement 490 may affect impedances of termination devices 446, 468 and the driver 410. The termination devices 446, 468 may each be associated with a load impedance to match line impedance and reduce signal reflection along the data net 406. A fourth resistor arrangement 444 may be coupled to the memory controller 404. A voltage at the fourth resistor arrangement 444 may affect impedances of the terminal devices 442, 466 and the driver 452.

The system 400 may thus train the memory device 402 and the memory controller 404 using a combination of a write operation and a read operation. For instance, the impedance of the driver 452 of the memory controller 404 may be set using a write operation, and the impedance of termination devices 442, 466 of the memory controller 404 may be set using a read operation. The system 400 may use both high and low voltage test paths in each read and write operation. The adjustment of the high and low voltage values may reduce impedance mismatches by adjusting the reference voltage to yield improvements in timing margins. The system 400 may facilitate increased data accuracy, timing margins, and processing speed.

Figure 5:
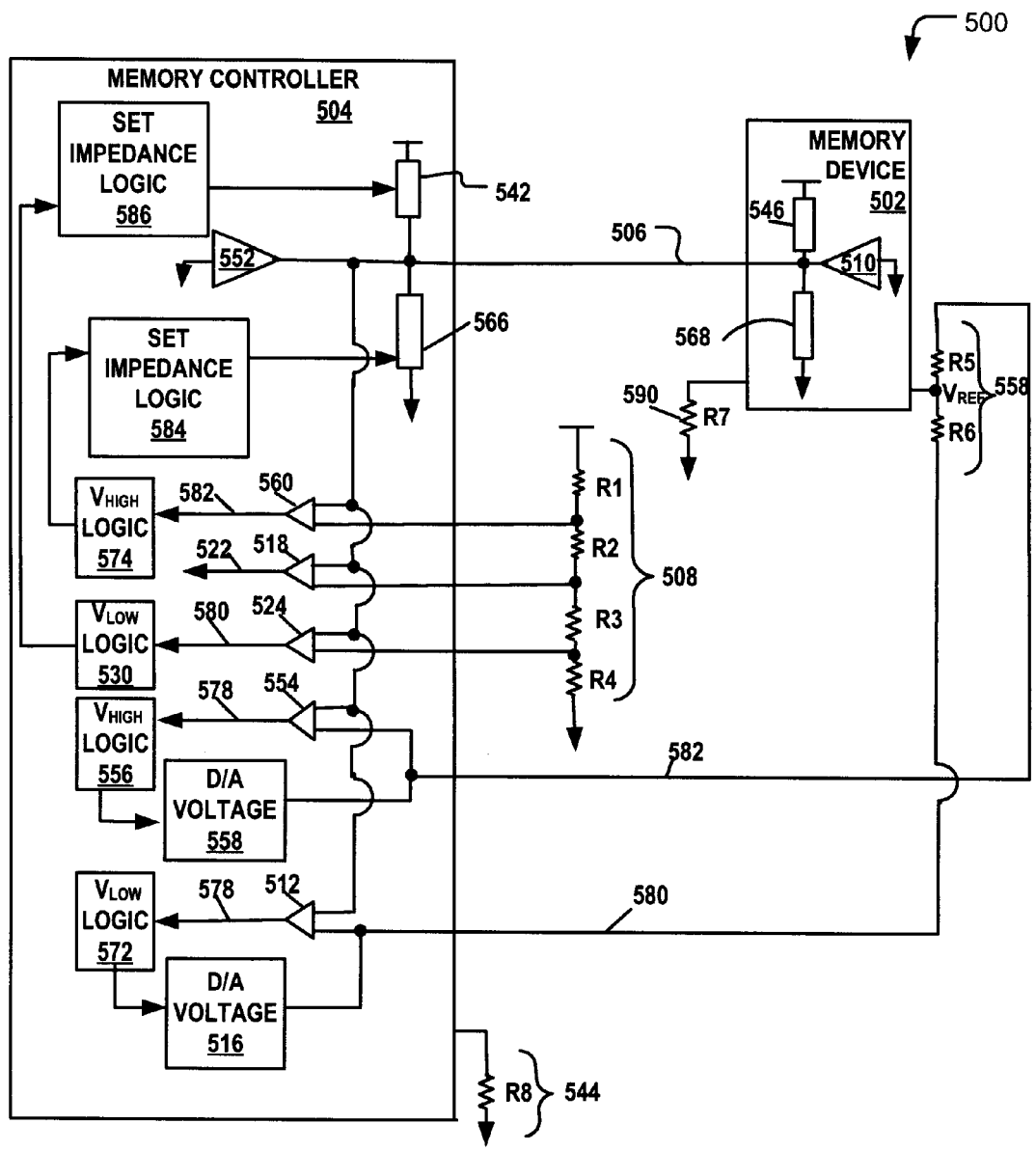
FIG. 5 is a block diagram of a fifth embodiment of a system configured to train a memory device and a memory controller using a combination of a write operation and a read operation.

FIG. 5 shows a fifth embodiment of a system 500 configured to train a memory device 502 and a memory controller 504 using a combination of a write operation and a read operation. For example, a reference voltage ($V_{ref}$) associated with the memory device 502 may be set using a write operation, and impedances of termination devices 542, 566 of the memory controller 504 may be set using a read operation. The system 500 may use both high and low voltage test paths in each read and write operation.

The memory device 502 may be coupled to the memory controller 504 via a data net 506. Training may include adjusting one more operating parameters of the memory device 502 and the memory controller 504. For instance, the training may include setting a pull up impedance at the termination device 542 and setting a pull down impedance at the termination device 566. In another example, an operating parameter may include the reference voltage associated with the memory device 502.

The data net 506 may couple a driver 510 of the memory device 502 to an input port of a comparator 524 of the memory controller 504. A second input of the comparator 524 may be coupled to a first resistor arrangement 508. The first resistor arrangement 508 may include multiple resistors R1, R2, R3, and R4. The first resistor arrangement 508 may provide a low voltage value to the second input of the comparator 524. The output of the comparator 524 may comprise a low test path 580 coupled to a $V_{low}$ logic 530 configured to determine a low voltage value. The $V_{low}$ logic 530 may be coupled to set impedance logic 586. The set impedance logic 586 may be configured to pull up the impedance at the termination device 542.

The data net 506 may additionally be coupled to an input port of a comparator 560 of the memory controller 504. A second input of the comparator 560 may be coupled to the first resistor arrangement 508. The first resistor arrangement 508 may provide a high voltage value to the second input of the comparator 560. The output of the comparator 560 may comprise a high test path 582 coupled to a $V_{high}$ logic 574 configured to determine a high voltage value. The $V_{high}$ logic 574 may be coupled to set impedance logic 584. The set impedance logic 584 may be configured to pull down the impedance at the termination device 566.

The data net 506 may additionally be coupled to a first input of a comparator 518. The resistor arrangement 508 may provide the reference voltage to a second input of the comparator 518. The output of the comparator 518 may comprise a functional path 522 associated with a functional device (not shown). During a read operation, the data of the functional path 522 may be compared to the data of the low test path 580 and the high test path 582. Results of the comparison may be used to set or adjust at least one of the impedances at the termination devices 542, 566. For example, the correctness of the high and low test path data may be determined based on data of the functional path 522. A percentage of the instances when correct data (or incorrect data) is read may be determined by comparing the test data with the functional data. A predetermined range, ratio, set point, or other criteria may be specified, as described herein.

During a write operation, a comparator 512 may receive a data signal at a first input coupled to the data net 506. A second input of the comparator 512 may be coupled to a low voltage portion of a second resistor arrangement 558. The second resistor arrangement 558 may include resistors R5 and R6 and may provide a reference voltage to the memory device 502. The output of the comparator 512 may comprise a low test path 578 coupled to a $V_{low}$ logic 572 configured to determine a low voltage value. The $V_{low}$ logic 572 may be coupled to a D/A voltage device 516. The $V_{high}$ logic 572 may be configured to instruct the D/A voltage device 516 to selectively increment or decrement the low voltage value at the second resistor arrangement 558 during a write operation. For instance, the low voltage value may be adjusted when the data of the low test path 578 falls outside of a predetermined range, ratio, set point, or other criteria when compared to corresponding data of the functional path 522.

A comparator 554 may receive a data signal at a first input coupled to the data net 506. A second input of the comparator 554 may be coupled to a high voltage portion of the second resistor arrangement 558. The output of the comparator 554 may comprise a high test path 578 coupled to a $V_{high}$ logic 556 configured to determine a high voltage value. The $V_{high}$ logic 556 may be coupled to a D/A voltage device 558. The $V_{high}$ logic 556 may be configured to instruct the D/A voltage device 558 to selectively increment or decrement the high voltage value at the second resistor arrangement 558 during a write operation. For example, the high voltage value may be adjusted when the data of the high test path 578 falls outside of a predetermined range, ratio, set point, or other criteria when compared to corresponding data of the functional path 522.

As shown in FIG. 5, the memory controller 504 may include termination devices 542, 566 and a third resistor arrangement 544 that includes resistor R8. A voltage present at the third resistor arrangement 544 may affect impedances of the termination devices 542, 566 and the driver 552. The memory device 502 may include termination devices 546, 568 and a fourth resistor arrangement 590 that includes resistor R7. A voltage present at the fourth resistor arrangement 590 may affect impedances of the termination devices 546, 568 and the driver 510. The termination devices 542, 546, 566, and 568 may each be associated with a load impedance to match line impedance and reduce signal reflection along the data net 506.

The system 500 may train voltage values between the memory controller 504 and the memory device 502 using a combination of a read and a write operation. For instance, the reference voltage associated with the memory controller 504 may be set using a write operation, and the impedance of the termination devices 542, 566 of the memory controller 504 may be set using a read operation. Data may be read and compared to functional data during real time. System operation may remain uninterrupted while the high and the low voltage values are selectively updated. The automatic updates may reduce impedance mismatches and offset issues.

Figure 6:
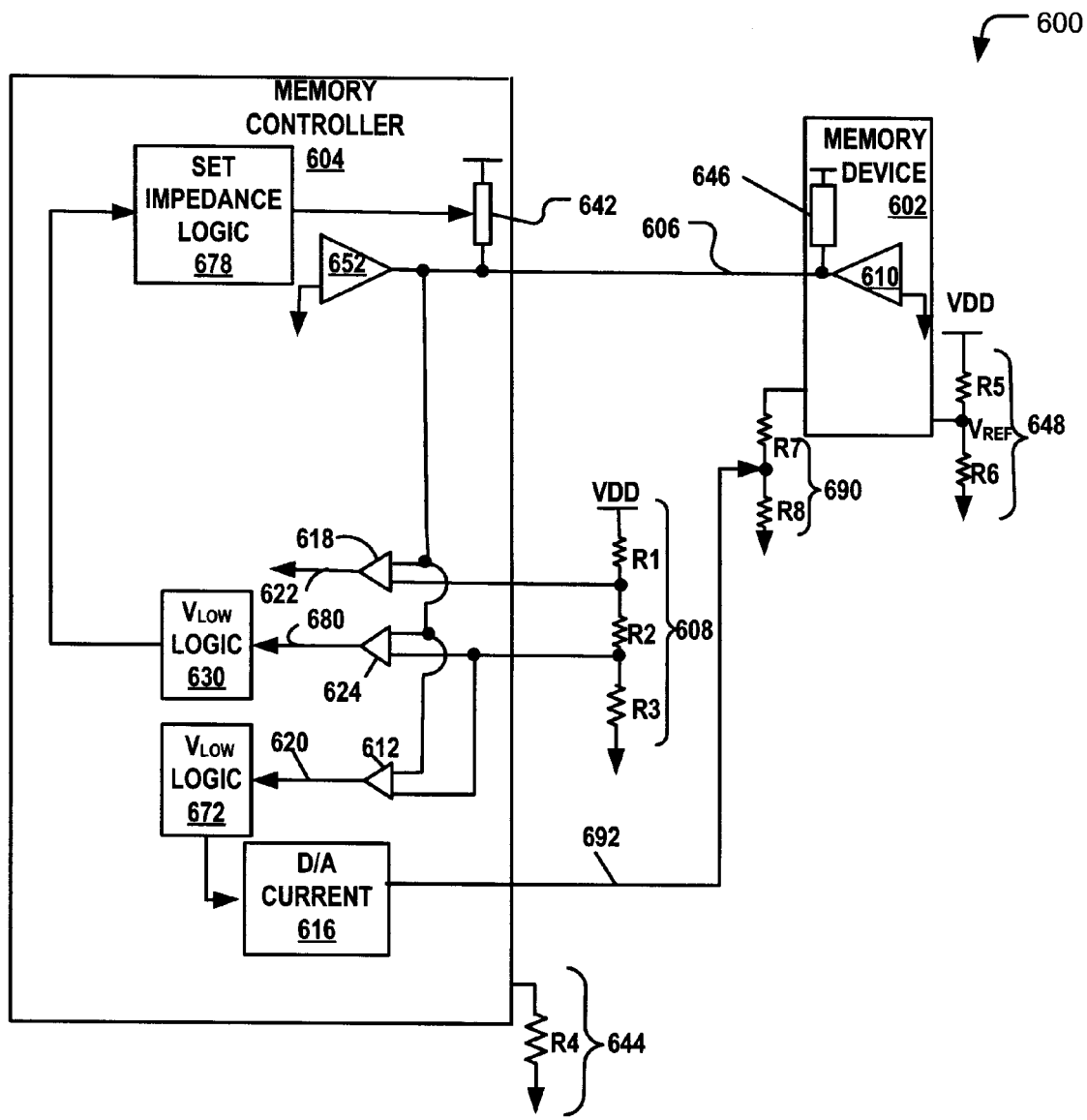
FIG. 6 is a block diagram of a sixth embodiment of a system configured to train a memory device and a memory controller using a combination of a write operation and a read operation.

FIG. 6 shows a sixth embodiment of a system 600 configured to train a memory device 602 and a memory controller 604 using a combination of a write operation and a read operation. For example, during a write operation, a voltage at a first resistor arrangement 690 may be set to calibrate a driver 610 of the memory device 602 with an offset from the memory controller 604. An impedance of a termination device 642 of the memory controller 604 may be set using a read operation. As with other the other embodiments described herein, the system 600 may comprise a communications bus.

The memory device 602 may be coupled to the memory controller 604 via a data net 606. Training may include adjusting one more operating parameters of at least one of the memory device 602 and the memory controller 604. For instance, the training may include setting a pull up impedance at the termination device 642. In another example, an operating parameter may include a voltage at the memory device 602 and associated with an offset of the memory controller 604.

The data net 606 may couple the driver 610 of the memory device 602 to an input port of a comparator 624 of the memory controller 604. A second input of the comparator 624 may be coupled to a second resistor arrangement 608. The second resistor arrangement 608 may include multiple resistors R1, R2, and R3. The second resistor arrangement 608 may provide a low voltage value to the second input of the comparator 624. The output of the comparator 624 may comprise a low test path 680 coupled to a $V_{low}$ logic 630 configured to determine a low voltage value. The $V_{low}$ logic 630 may be coupled to set impedance logic 678. The set impedance logic 678 may be configured to pull up the impedance at the termination device 642.

The data net 606 may additionally be coupled to a first input of a comparator 618. The resistor arrangement 608 may provide a reference voltage to a second input of the comparator 618. The output of the comparator 618 may comprise a functional path 622 associated with a functional device (not shown). During a read operation, the data of the functional path 622 may be compared to the data of the low test path 680. Results of the comparison may be used to set or adjust the impedance at the termination device 642. For example, the correctness of the low test path data may be determined based on data of the functional path 622. A percentage of the instances when correct data (or incorrect data) is read may be determined by comparing the test data with the functional data. A predetermined range, ratio, set point, or other criteria may be specified, as described herein.

During a write operation, a comparator 612 may receive a data signal at a first input coupled to the data net 606. A second input of the comparator 612 may be coupled to a low voltage portion of the second resistor arrangement 608. The output of the comparator 612 may comprise a low test path 620 coupled to a $V_{low}$ logic 672 configured to determine a low voltage value. The $V_{low}$ logic 672 may be coupled to a D/A current device 616. The $V_{high}$ logic 672 may be configured to instruct the D/A current device 616 to selectively increment or decrement a current value at the first resistor arrangement 690 during a write operation. For instance, the current may be adjusted according to an offset associated with the memory controller 604. The offset may be determined when the data of the low test path 620 falls outside of a predetermined range, ratio, set point, or other criteria when compared to corresponding data of the functional path 622. The first resistor arrangement 690 may include multiple resistors R7, R8. When the current is applied at the first resistor arrangement 690, the driver 610 may be calibrated. The voltage on the data net 606 may be set via the driver 610 according to the current applied to the first resistor arrangement 690.

As shown in FIG. 6, the memory controller 604 may be coupled to a third resistor arrangement 644 that includes a resistor R4. A voltage at the third resistor arrangement 644 may affect impedances of the termination device 642 and the driver 652. The memory device 602 may be coupled to a fourth resistor arrangement 648 that includes multiple resistors R5, R6. The fourth resistor arrangement 648 may be configured to provide a reference voltage to the memory device 602. The memory device 602 may further include a termination device 646. The termination devices 642, 646 may each be associated with a load impedance to match line impedance and reduce signal reflection along the data net 606.

The system 600 may train voltage values between the memory controller 604 and the memory device 602 using a combination of a read and a write operation. For example, the voltage value affecting the driver 610 of the memory device 602 may be set according to a memory controller offset using a write operation. The impedance of the termination device 642 of the memory controller 604 may be set using a read operation. The system 600 may use low voltage test paths in each read and write operation.

Figure 7:
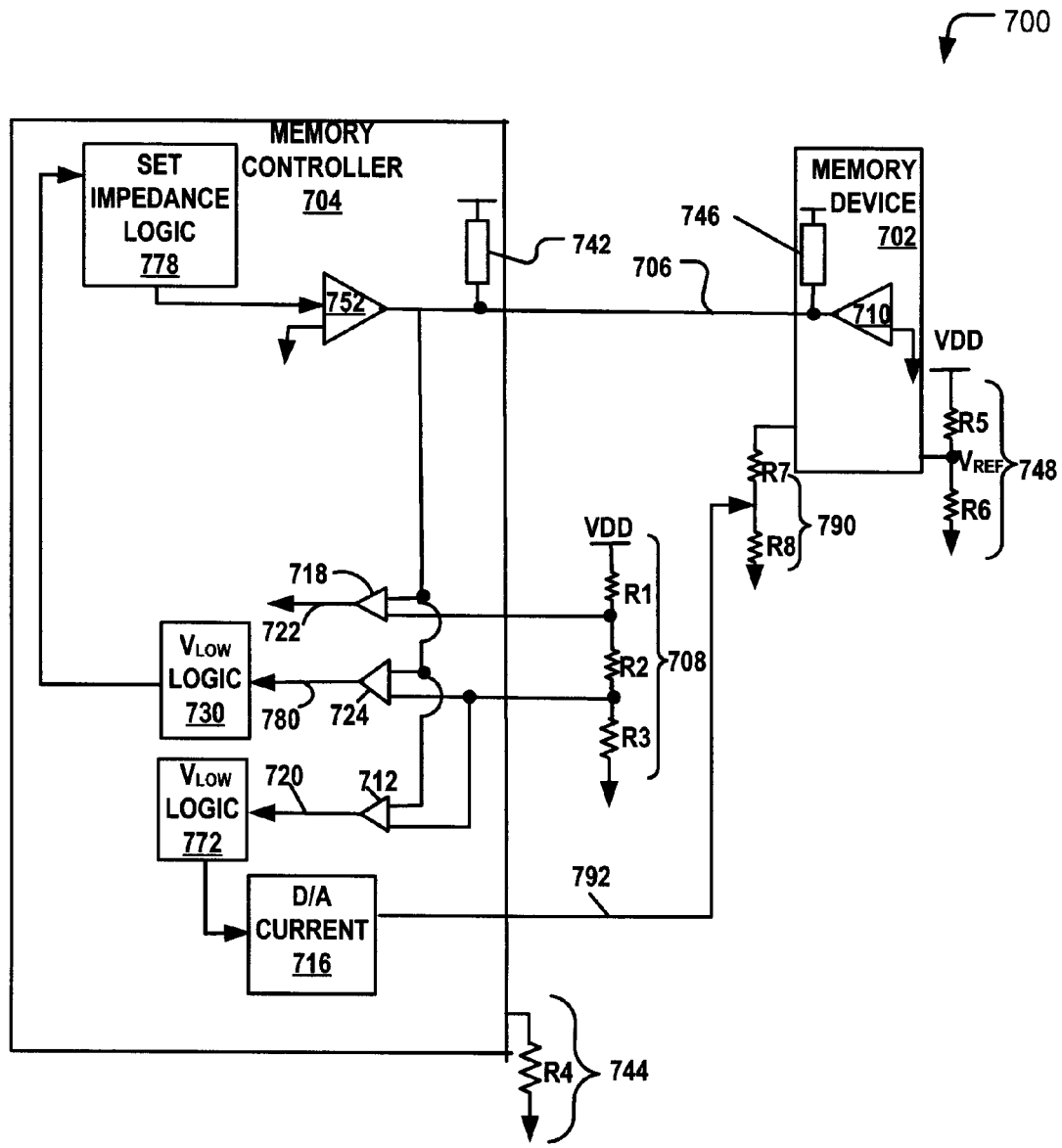
FIG. 7 is a block diagram of a seventh embodiment of a system configured to train a memory device and a memory controller using a combination of a write operation and a read operation.

FIG. 7 shows a seventh embodiment of a system 700 configured to train a memory device 702 and a memory controller 704 using a combination of a write operation and a read operation. For instance, during a read operation, a voltage at a first resistor arrangement 790 may be set to calibrate a driver 710 of the memory device 702 according to a memory controller offset. An impedance of a driver 752 of the memory controller 704 may be set using a write operation.

The memory device 702 may be coupled to the memory controller 704 via a data net 706. Training may include adjusting one more operating parameters of at least one of the memory device 702 and the memory controller 704. For example, the training may include setting an impedance of the driver 752. In another example, an operating parameter may include a voltage offset applied to the driver 710 of the memory device 702.

The data net 706 may couple the driver 710 of the memory device 702 to an input port of a comparator 724 of the memory controller 704. A second input of the comparator 724 may be coupled to a second resistor arrangement 708. The second resistor arrangement 708 may include multiple resistors R1, R2, and R3. The second resistor arrangement 708 may provide a low voltage value to the second input of the comparator 724. The output of the comparator 724 may comprise a low test path 780 coupled to a $V_{low}$ logic 730 configured to determine a low voltage value. The $V_{low}$ logic 730 may be coupled to set impedance logic 778. The set impedance logic 778 may be configured to set the impedance of the driver 752.

The data net 706 may additionally be coupled to a first input of a comparator 718. The resistor arrangement 708 may provide a reference voltage to a second input of the comparator 718. The output of the comparator 718 may comprise a functional path 722 associated with a functional device (not shown). During a write operation, the data of the functional path 722 may be compared to the data of the low test path 780. Results of the comparison may be used to set or adjust the impedance at the driver 752. For instance, the correctness of the low test path data may be determined based on data of the functional path 722. A percentage of the instances when correct data (or incorrect data) is read may be determined by comparing the test data with the functional data. A predetermined range, ratio, set point, or other criteria may be specified, as described herein.

During a read operation, a comparator 712 may receive a data signal at a first input coupled to the data net 706. A second input of the comparator 712 may be coupled to a low voltage portion of the second resistor arrangement 708. The output of the comparator 712 may comprise a low test path 720 coupled to a $V_{low}$ logic 772 configured to determine a low voltage value. The $V_{low}$ logic 772 may be coupled to a D/A current device 716. The $V_{high}$ logic 772 may be configured to instruct the D/A current device 716 to selectively increment or decrement a current value at the first resistor arrangement 790 during the read operation. For example, the current may be adjusted according to an offset associated with the memory controller 704. The offset may be determined when the data of the low test path 720 falls outside of a predetermined range, ratio, set point, or other criteria when compared to corresponding data of the functional path 722. The first resistor arrangement 790 may include multiple resistors R7, R8. When the current is applied at the first resistor arrangement 790, the driver 710 may be calibrated. The voltage on the data net 706 may be set via the driver 710 according to the current applied to the first resistor arrangement 790.

As shown in FIG. 7, the memory controller 704 may be coupled to a third resistor arrangement 744 that includes a resistor R4. A voltage at the third resistor arrangement 744 may affect impedances of the termination device 742 and the driver 752. The memory device 702 may be coupled to a fourth resistor arrangement 748 that includes resistors R5, R6. The fourth resistor arrangement 748 may be configured to provide a reference voltage to the memory device 702. The memory device 702 may further include a termination device 746. The termination devices 742, 746 may each be associated with a load impedance to match line impedance and reduce signal reflection along the data net 706.

The system 700 may train voltage values between the memory controller 704 and the memory device 702 using a combination of a read and a write operation. For instance, the voltage value affecting the driver 710 of the memory device 702 may be set according to a memory controller offset using a read operation. The impedance of the driver 752 of the memory controller 704 may be set using a write operation. The system 700 may use low voltage test paths in each read and write operation.

Figure 8:
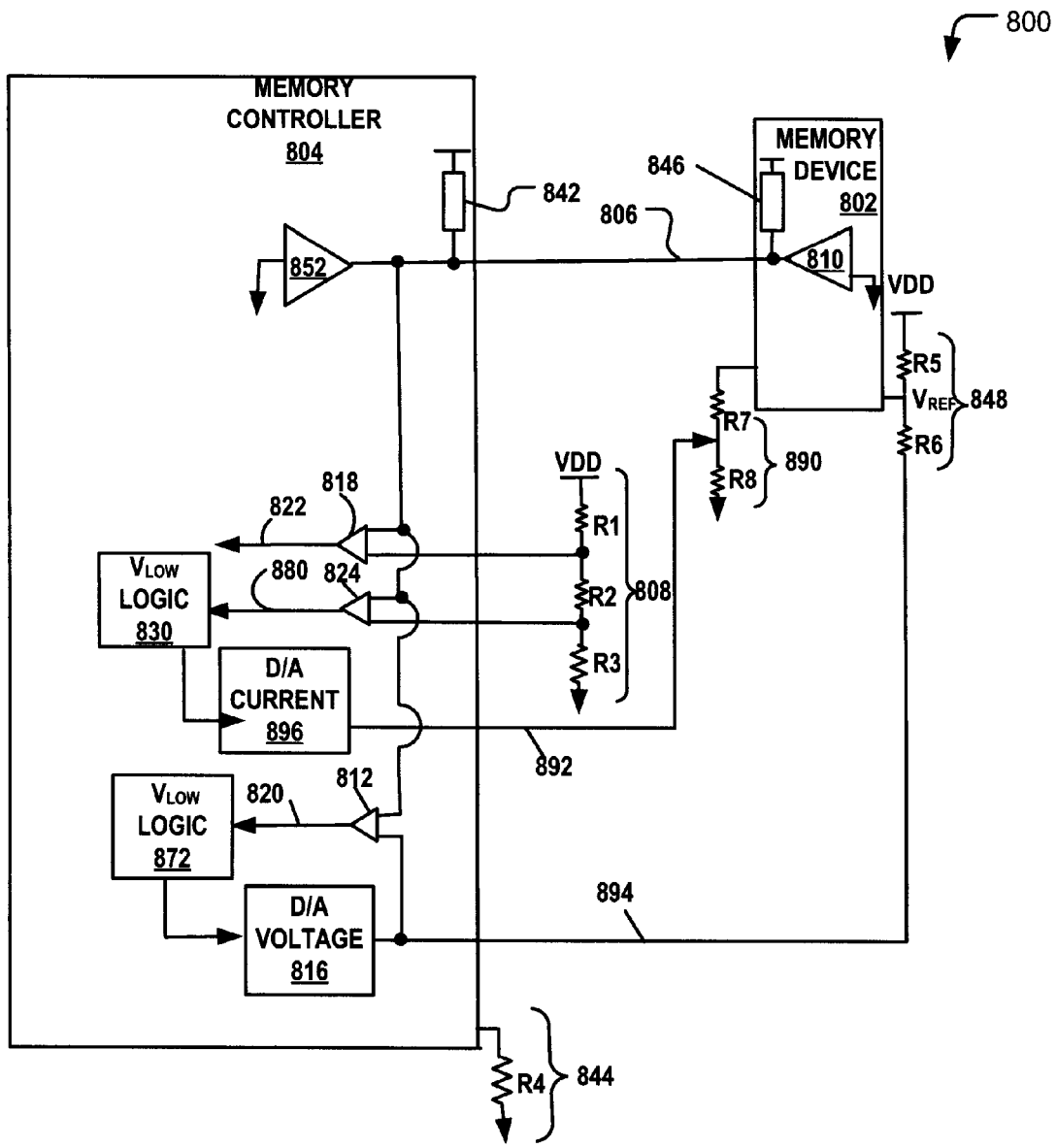
FIG. 8 is a block diagram of an eighth embodiment of a system configured to train a memory device and a memory controller using a combination of a write operation and a read operation.

FIG. 8 shows an eighth embodiment of system 800 configured to train a memory device 802 and a memory controller 804 using a combination of a write and a read operation. For example, during a read operation, a voltage at a first resistor arrangement 890 may be set to calibrate a driver 810 of the memory device 802 according to a memory controller offset. A reference voltage ($V_{ref}$) associated with the memory device 802 may be set during a write operation. The system 800 may comprise a communications bus.

The memory device 802 may be coupled to the memory controller 804 via a data net 806. Training may include adjusting one more operating parameters of at least one of the memory device 802 and the controller 804. For instance, the training may include setting the reference voltage associated with the memory driver 802. In another example, an operating parameter may include the voltage offset applied to the driver 810 of the memory device 802.

The data net 806 may be coupled to a first input of a comparator 818. A first resistor arrangement 808 may provide a reference voltage to a second input of the comparator 818.

The output of the comparator 818 may comprise a functional path 822 associated with a functional device (not shown). During a read operation, a comparator 824 may receive a data signal at a first input coupled to the data net 806. A second input of the comparator 824 may be coupled to a low voltage portion of a second resistor arrangement 808. The second resistor arrangement 808 may include multiple resistors R1, R2, and R3.

The output of the comparator 824 may comprise a low test path 880 coupled to a $V_{low}$ logic 830 configured to determine a low voltage value. The $V_{low}$ logic 830 may be coupled to a D/A current device 896. The $V_{low}$ logic 830 may be configured to instruct a D/A current device 896 to selectively increment or decrement a current value at the first resistor arrangement 890 during the read operation. For example, the current may be adjusted according to an offset associated with the memory controller 804. The offset may be determined when the data of the low test path 880 falls outside of a predetermined range, ratio, set point, or other criteria when compared to corresponding data of the functional path 822. When the appropriate current is applied at the first resistor arrangement 890, the driver 810 may be calibrated. The voltage on the data net 806 may be set via the driver 810 according to the current applied to the first resistor arrangement 808.

During a write operation, a comparator 812 may receive a data signal at a first input coupled to the data net 806. A second input of the comparator 812 may be coupled to a low voltage portion of a third resistor arrangement 848. The third resistor arrangement 848 may include multiple resistors R5, R6 and may provide the reference voltage to the memory device 802. The output of the comparator 812 may comprise a low test path 820 coupled to a $V_{low}$ logic 872 configured to determine a low voltage value. The $V_{low}$ logic 872 may be coupled to a D/A voltage device 816. The $V_{low}$ logic 872 may be configured to instruct the D/A voltage device 816 to selectively increment or decrement the low voltage value at the third resistor arrangement 848 during a write operation. For instance, the low voltage value may be adjusted when the data of the low test path 820 falls outside of a predetermined range, ratio, set point, or other criteria when compared to corresponding data of the functional path 822.

As shown in FIG. 8, the memory controller 804 may be coupled to a fourth resistor arrangement 844 that includes a resistor R4. A voltage a the fourth resistor arrangement 844 may affect impedances of a termination device 842 and the driver 852. The memory device 802 may include a termination device 846. The termination devices 842, 846 may each be associated with a load impedance to match line impedance and reduce signal reflection along the data net 806.

The system 800 may train voltage values between the memory controller 804 and the memory device 802 using a combination of a read and a write operation. For example, the voltage value affecting the driver 810 of the memory device 802 may be set according to a memory controller offset using a read operation. The reference voltage associated with the memory device 802 may be set using a write operation. The system 800 may use low voltage test paths in each read and write operation.

Figure 9:
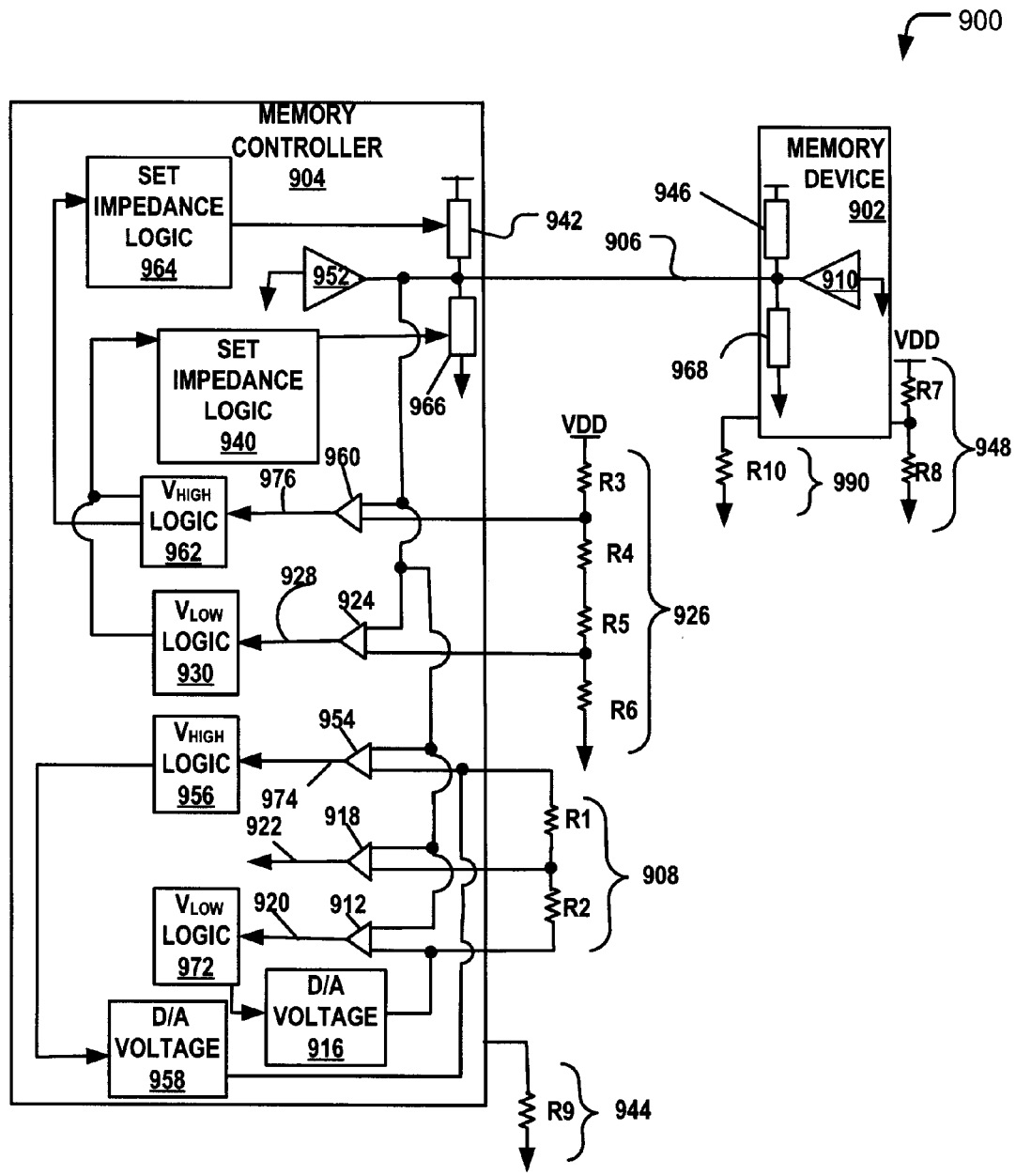
FIG. 9 is a block diagram of a first embodiment of a system configured to train a memory device and a memory controller using a combination of read operations.

FIG. 9 shows a first embodiment of a system 900 configured to train a memory device 902 and a memory controller 904 using a combination of multiple read operations. For instance, the impedances of termination devices 942, 966 of the memory controller 904 may be set using a first read operation, and a reference voltage of a first resistor arrangement 908 may be set using a second read operation. The system 900 may use both high and low voltage test paths in each read operation. The system 900 may comprise a communications bus.

The memory device 902 may be coupled to the memory controller 904 via a data net 906. Training may include adjusting one more operating parameters of the memory controller 904. For example, the training may include setting a reference voltage ($V_{ref}$) associated with the first resistor arrangement 908. A low and a high voltage value may be used to set the reference voltage may be automatically determined and updated. The reference voltage may be set before and updated during operation. In another example, an operating parameter may include impedances of the termination devices 942, 966 of the memory controller 904. The impedances may be set and adjusted to train the memory controller 904 during the first read operation.

The data net 906 may couple a driver 910 of the memory device 902 to an input port of a comparator 912 of the memory controller 904. A second input of the comparator 912 may be coupled to the first resistor arrangement 908. The first resistor arrangement 908 may provide a low voltage value to the second input of the comparator 912. The resistor arrangement 908 may include a first resistor R1 associated with the high voltage value. The resistor arrangement 908 may further include a second resistor R2 associated with the low voltage value. The output of the comparator 912 may comprise a low test path 920 coupled to a $V_{low}$ logic 972 configured to determine a low voltage value. The $V_{low}$ logic 972 may be coupled to a D/A voltage device 916. The $V_{low}$ logic 972 may be configured to instruct the D/A voltage device 916 to selectively increment or decrement the low voltage value at the first resistor arrangement 908.

The data net 906 may additionally be coupled to an input port of a comparator 954 of the memory controller 904. A second input of the comparator 954 may be coupled to the first resistor arrangement 908. The first resistor arrangement 908 may provide a high voltage value to the second input of the comparator 954. The output of the comparator 954 may comprise a high test path 974 coupled to a $V_{high}$ logic 956 configured to determine a high voltage value. The $V_{high}$ logic 956 may be coupled to a D/A voltage device 958. The $V_{high}$ logic 956 may be configured to instruct the D/A voltage device 958 to selectively increment or decrement the high voltage value at the first resistor arrangement 908.

The data net 906 may additionally be coupled to a first input of a comparator 918. The resistor arrangement 908 may provide the reference voltage to a second input of the comparator 918. The output of the comparator 918 may comprise a functional path 922 associated with a functional device (not shown). During a read operation, the data of the functional path 922 may be compared to the data of the low test path 920 and the high test path 974. Results of the comparison may be used to set or adjust at least one of the high and low voltage values. For instance, the correctness of the high and low test path data may be determined based on data of the functional path 922. A percentage of the instances when correct data (or incorrect data) is read may be determined by comparing the test data with the functional data. A predetermined range, ratio, set point, or other criteria may be specified, as described herein.

For example, the correctness of the test path data may be determined based on data of the functional path 922. A percentage of the instances when correct data (or incorrect data) is read in the test data path 920 may be determined by comparing the test data with the functional data. For instance, the data of the functional path 922 may be used to determine if a one or a zero of the test path 920 correctly corresponds to a one or zero of the functional path. At a point when the incorrect data of the test path 920 switches (i.e., from a zero to a one, or from a one to a zero), the voltage value may be set correctly. A predetermined range, ratio, set point, or other criteria may be specified. For example, the low voltage value may be too low until some percentage of the data of the test path 920 matches data of the functional path 922.

During a second read operation, a comparator 924 may receive a data signal at a first input coupled to the data net 906. A second input of the comparator 924 may be coupled to a second resistor arrangement 926. The second resistor arrangement 926 may include resistors R3, R4, R5, and R6. The output of the comparator 924 may comprise a low test path 928 coupled to a $V_{low}$ logic 930 configured to determine a low voltage value. The $V_{low}$ logic 930 may be coupled to set impedance logic 940. The $V_{low}$ logic 930 may be configured to instruct the set impedance logic 940 to pull down the impedance of the termination device 966. The impedance of the termination device 966 may be adjusted to train the memory controller 904 during the read operation. For instance, impedance of the termination device 966 may be adjusted when the data of the low test path 928 falls outside of a predetermined range, ratio, set point, or other criteria when compared to corresponding data of the functional path 922.

A comparator 960 may receive a data signal at a first input coupled to the data net 906. A second input of the comparator 960 may be coupled to the second resistor arrangement 926. The output of the comparator 960 may comprise a high test path 976 coupled to a $V_{high}$ logic 962 configured to determine a high voltage value. The $V_{high}$ logic 962 may be coupled to set impedance logic 964. The $V_{high}$ logic 962 may be configured to instruct the set impedance logic 964 to pull up the impedance of the termination device 942. The impedance of the termination device 966 may be adjusted to train the memory controller 904 during the read operation. For example, impedance of the termination device 966 may be adjusted when the data of the high test path 976 falls outside of a predetermined range, ratio, set point, or other criteria when compared to corresponding data of the functional path 922.

A third resistor arrangement that is coupled to the memory device 902 and that includes resistors R7, R8 may be configured to provide a reference voltage to the memory device 902. A fourth resistor arrangement 944 that includes resistor R9 coupled to the memory controller 904 may affect impedances of the termination devices 942, 966 and the driver 952. A fifth resistor arrangement 990 that includes resistor R10 coupled to the memory device 902 may affect impedances of termination devices 946, 968 and the driver 910.

FIG. 9 thus shows an embodiment of a system 900 configured to train voltage values between a memory controller and a memory device using a combination of read operations. For instance, the impedances of the termination devices 942, 966 may be set using a first read operation, and the reference voltage of the resistor arrangement 908 may be set using a second read operation. The system 900 may use both high and low voltage test paths in each read and write operation. The system 900 may facilitate increased data accuracy, timing margins, and processing speed.

Figure 10:
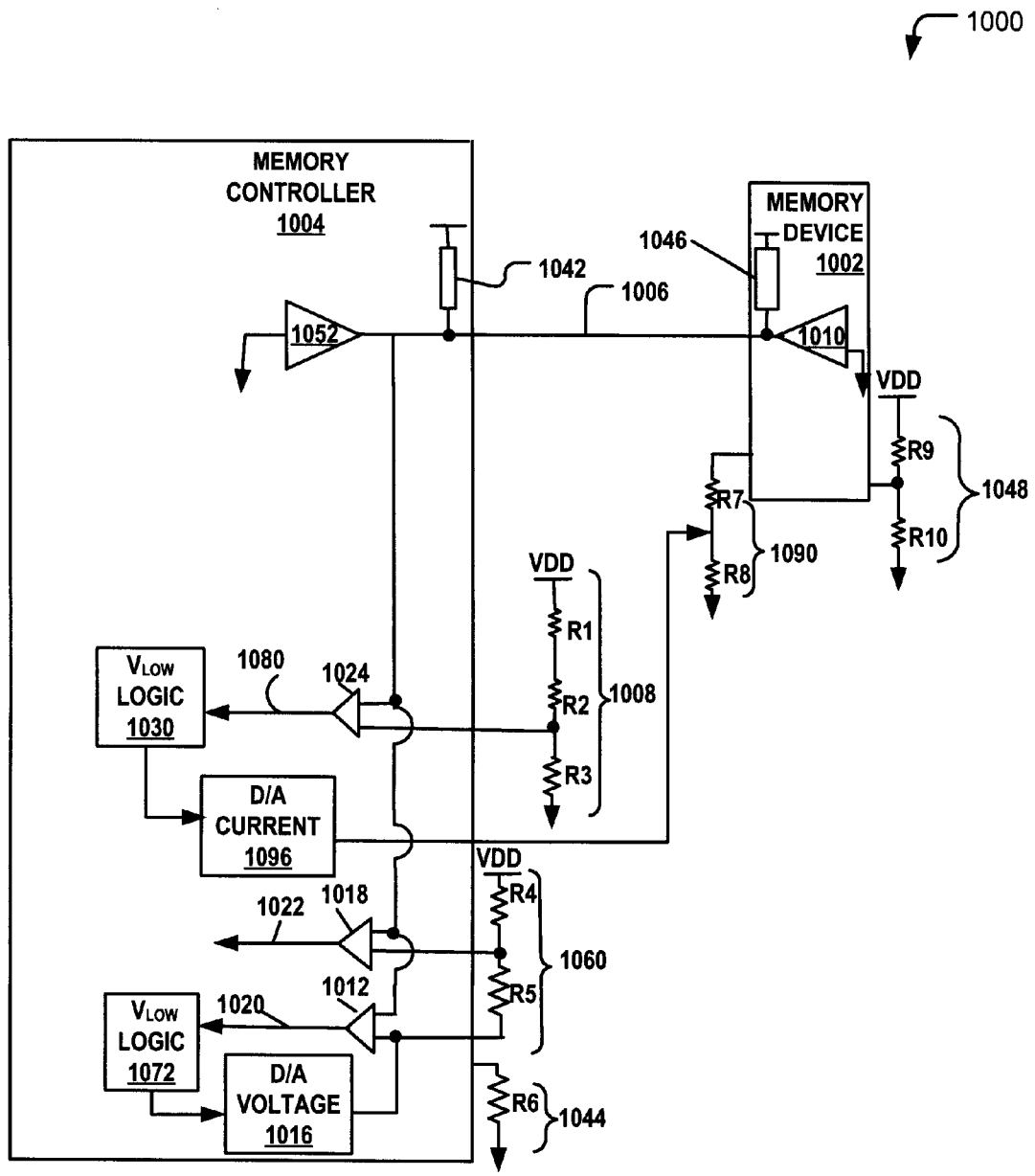
FIG. 10 is a block diagram of a second embodiment of a system configured to train a memory device and a memory controller using a combination of read operations.

FIG. 10 shows a second embodiment of a system 1000 configured to train a memory device 1002 and a memory controller 1004 using a combination of read operations. For example, during a first read operation, a voltage at a first resistor arrangement 1090 may be set to calibrate a driver 1010 of the memory device 1002 according to a memory controller offset. A reference voltage ($V_{ref}$) associated with a second resistor arrangement 1060 and the memory controller 1004 may be set during a second read operation.

The memory device 1002 may be coupled to the memory controller 1004 via a data net 1006. Training may include adjusting one more operating parameters of the memory device 1002 and the memory controller 1004. For instance, the training may include setting the reference voltage associated with the memory controller 1004. In another example, an operating parameter may include the voltage offset applied to the driver 1010 of the memory device 1002.

The data net 1006 may be coupled to a first input of a comparator 1018. The second resistor arrangement 1060 may provide a reference voltage to a second input of the comparator 1018. The output of the comparator 1018 may comprise a functional path 1022 associated with a functional device (not shown). During a first read operation, a comparator 1024 may receive a data signal at a first input coupled to the data net 1006. A second input of the comparator 1024 may be coupled to a low voltage portion of a third resistor arrangement 1008. The output of the comparator 1024 may comprise a low test path 1080 coupled to a $V_{low}$ logic 1030 configured to determine a low voltage value. The $V_{low}$ logic 1030 may be coupled to a D/A current device 1096. The $V_{low}$ logic 1030 may be configured to instruct the D/A current device 1096 to selectively increment or decrement a current value at the first resistor arrangement 1090 during the read operation. For example, the current may be adjusted according to an offset associated with the memory controller 1004. The offset may be determined when the data of the low test path 1080 falls outside of a predetermined range, ratio, set point, or other criteria when compared to corresponding data of the functional path 1022. The third resistor arrangement 1008 may include multiple resistors R1, R2, and R3. When the adjusted current is applied at the first resistor arrangement 1090, the driver 1010 may be calibrated. The voltage on the data net 1006 may be set via the driver 1010 according to the current applied to the first resistor arrangement 1090.

During a second read operation, a comparator 1012 may receive a data signal at a first input coupled to the data net 1006. A second input of the comparator 1012 may be coupled to a low voltage portion of the second resistor arrangement 1060. The second resistor arrangement 1060 may include multiple resistors R4, R5. The output of the comparator 1012 may comprise a low test path 1020 coupled to a $V_{low}$ logic 1072 configured to determine a low voltage value. The $V_{low}$ logic 1072 may be coupled to a D/A voltage device 1016. The $V_{low}$ logic 1072 may be configured to instruct the D/A voltage device 1016 to selectively increment or decrement the low voltage value at the second resistor arrangement 1060 during a read operation. For instance, the low voltage value may be adjusted when the data of the low test path 1020 falls outside of a predetermined range, ratio, set point, or other criteria when compared to corresponding data of the functional path 1022.

As shown in FIG. 10, the memory controller 1004 may be coupled to a fourth resistor arrangement 1044 that includes a resistor R6. A voltage at the fourth resistor arrangement 1044 may affect impedances at a termination device 1042 and the driver 1052. The memory device 1002 may include a termination device 1046. The termination devices 1042, 1046 may each be associated with a load impedance to match line impedance and reduce signal reflection along the data net 1006. The memory device 1002 may be coupled to a fifth resistor arrangement 1048 that includes multiple resistors R9, R10. The fifth resistor arrangement 1048 may be configured to provide a reference voltage to the memory device 1002.

The system 1000 may train voltage values between the memory controller 1004 and the memory device 1002 using a combination of a first read and a second read operation. For example, the voltage value affecting the driver 1010 of the memory device 1002 may be set according to a memory controller offset. The reference voltage associated with the memory controller 1004 may be set using a second read operation. The system 1000 may use low voltage test paths in each read and write operation.

Figure 11:
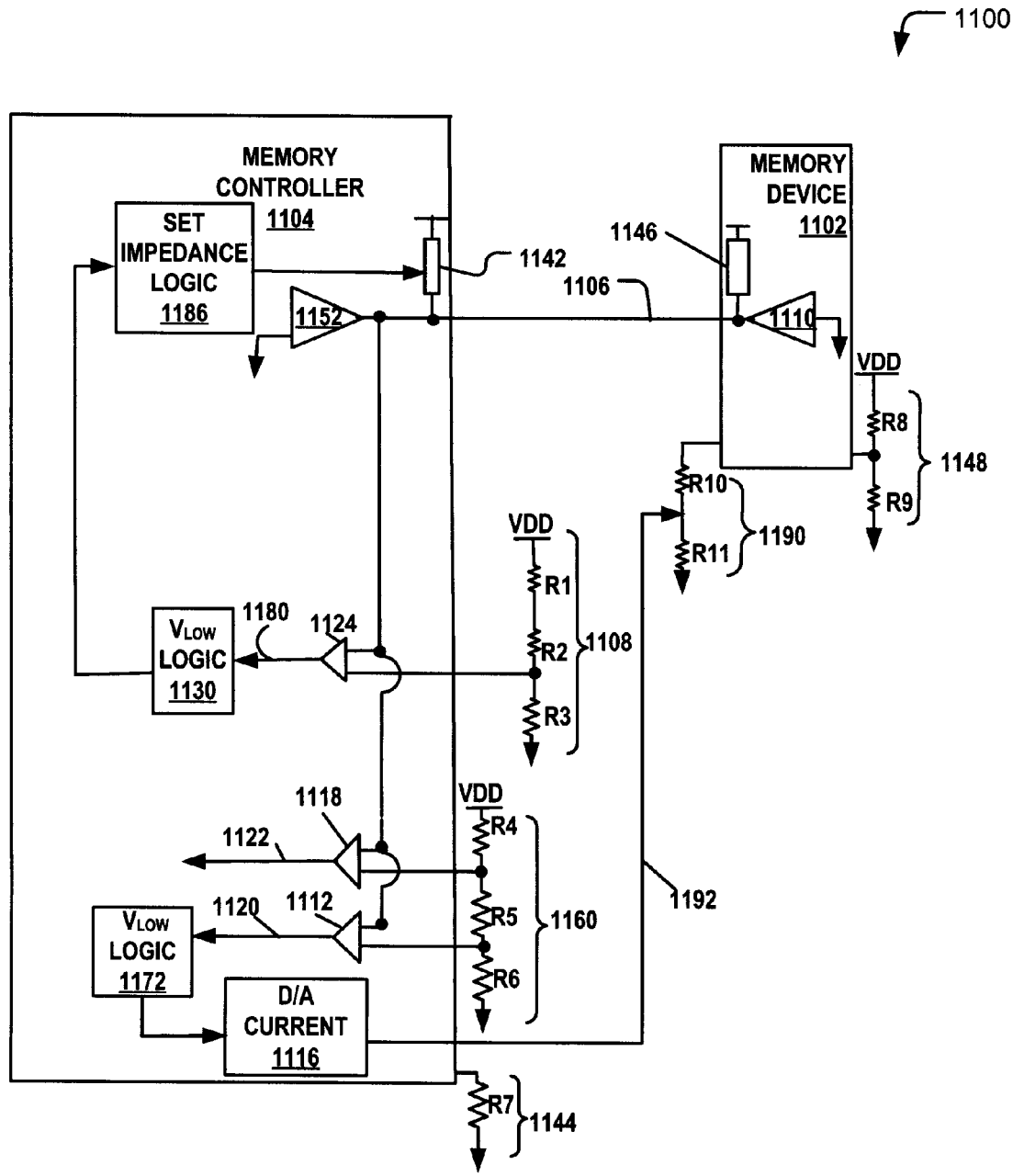
FIG. 11 is a block diagram of a third embodiment of a system configured to train a memory device and a memory controller using a combination of read operations.

FIG. 11 shows a third embodiment of a system 1100 configured to train a memory device 1102 and a memory controller 1104 using a combination of read operations. For instance, during a first read operation, a voltage at a first resistor arrangement 1190 may be set to calibrate a driver 1110 of the memory device 1102 according to a memory controller offset. An impedance of a termination device 1142 of the memory controller 1104 may be set during a second read operation. The system 1100 may comprise a communications bus.

The memory device 1102 may be coupled to the memory controller 1104 via a data net 1106. Training may include adjusting one more operating parameters of the memory device 1102 and the memory controller 1104. For example, the training may include setting the impedance of the termination device 1142 of the memory controller 1104. In another example, an operating parameter may include the voltage offset applied to the driver 1110 of the memory device 1102 via the first resistor arrangement 1190.

The data net 1106 may be coupled to a first input of a comparator 1118. A second resistor arrangement 1160 may provide a reference voltage to a second input of the comparator 1118. The output of the comparator 1118 may comprise a functional path 1122 associated with a functional device (not shown). During a first read operation, a comparator 1112 may receive a data signal at a first input coupled to the data net 1106. A second input of the comparator 1112 may be coupled to a low voltage portion of the second resistor arrangement 1160.

The output of the comparator 1112 may comprise a low test path 1120 coupled to a $V_{low}$ logic 1172 configured to determine a low voltage value. The $V_{low}$ logic 1172 may be coupled to a D/A current device 1116. The $V_{low}$ logic 1172 may be configured to instruct the D/A current device 1116 to selectively increment or decrement a current value at the first resistor arrangement 1190 during the read operation. For instance, the current may be adjusted according to an offset associated with the memory controller 1104. The offset may be determined when the data of the low test path 1120 falls outside of a predetermined range, ratio, set point, or other criteria when compared to corresponding data of the functional path 1122. The second resistor arrangement 1160 may include multiple resistors R4, R5, and R6. When the current is applied at the first resistor arrangement 1190, the driver 1110 may be calibrated. The voltage on the data net 1106 may be set via the driver 1110 according to the current applied to the first resistor arrangement 1190.

During a second read operation, a comparator 1124 may receive a data signal at a first input coupled to the data net 1106. A second input of the comparator 1112 may be coupled to a low voltage portion of a third resistor arrangement 1108. The third resistor arrangement 1108 may include multiple resistors R1, R2, and R3. The output of the comparator 11024 may comprise a low test path 1180 coupled to a $V_{low}$ logic 1130 configured to determine a low voltage value. The $V_{low}$ logic 1130 may be coupled to a set impedance device 1186. The $V_{low}$ logic 1130 may be configured to instruct the set impedance device 1186 to selectively pull up or pull down the impedance at the termination device 1142 during a read operation. For example, the impedance may be adjusted when the data of the low test path 1180 falls outside of a predetermined range, ratio, set point, or other criteria when compared to corresponding data of the functional path 1122.

As shown in FIG. 11, the memory controller 1104 may be coupled to a fourth resistor arrangement 1144 that includes a resistor R7. A voltage at the fourth resistor arrangement 1144 may affect impedances of the termination device 1142 and the driver 1152. The memory device 1102 may include a termination device 1146. The termination devices 1142, 1146 may each be associated with a load impedance to match line impedance and reduce signal reflection along the data net 1106. The memory device 1102 may be coupled to a fifth resistor arrangement 1148 that includes multiple resistors R8, R9. The fifth resistor arrangement 1148 may be configured to provide a reference voltage to the memory device 1102.

The system 1100 may train voltage values between the memory controller 1104 and the memory device 1102 using a combination of a first read and a second read operation. For instance, the impedance affecting the driver 1110 of the memory device 1102 may be set according to a memory controller offset. The impedance of the termination device 1142 of the memory controller 1104 may be set using a second read operation. The system 1100 may use low voltage test paths in each read and write operation to increase proving speed and timing margins.

Figure 12:
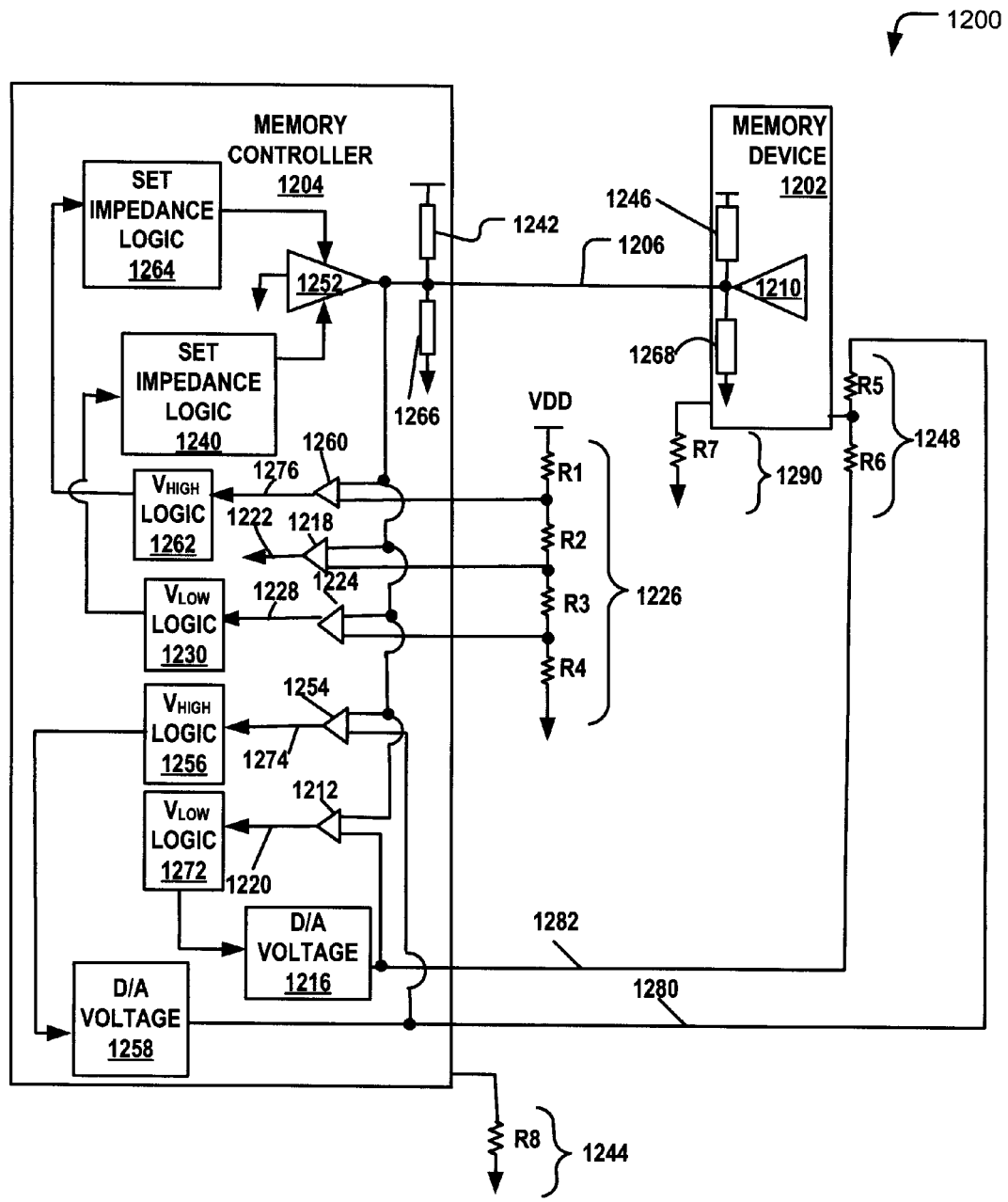
FIG. 12 is a block diagram of a first embodiment of a system configured to train a memory device and a memory controller using a combination of write operations.

FIG. 12 shows a first embodiment of a system 1200 configured to train a memory device 1202 and a memory controller 1204 using a combination of multiple write operations. For instance, the impedance of a driver 1252 of the memory controller 1204 may be set using a first write operation, and a reference voltage associated with the memory device 1202 may be set using a second write operation.

The memory device 1202 may be coupled to the memory controller 1204 via a data net 1206. Training may include adjusting one more operating parameters of the memory device 1202 and the memory controller 1204. For example, the training may include setting the reference voltage associated with the memory device 1202. In another example, an operating parameter may include an impedance of the driver 1252. The impedance may be set and adjusted to train the memory controller 1204 during the second write operation.

During a first write operation, a comparator 1212 may receive a data signal at a first input coupled to the data net 1206. A second input of the comparator 1212 may be coupled to a low voltage portion of a first resistor arrangement 1248. The first resistor arrangement 1248 may include resistors R5 and R6 and may provide a reference voltage to the memory device 1202. The output of the comparator 1212 may comprise a low test path 1220 coupled to a $V_{low}$ logic 1272 configured to determine a low voltage value. The $V_{low}$ logic 1272 may be coupled to a D/A voltage device 1216. The $V_{low}$ logic 1272 may be configured to instruct the D/A voltage device 1216 to selectively increment or decrement the low voltage value at the first resistor arrangement 1248 during a write operation. For instance, the low voltage value may be adjusted when the data of the low test path 1220 falls outside of a predetermined range, ratio, set point, or other criteria when compared to corresponding data of a functional path 1222.

A comparator 1254 may receive a data signal at a first input coupled to the data net 1206. A second input of the comparator 1254 may be coupled to a high voltage portion of the second resistor arrangement 1248. The output of the comparator 1254 may comprise a high test path 1274 coupled to a $V_{high}$ logic 1256 configured to determine a high voltage value. The $V_{high}$ logic 1256 may be coupled to a D/A voltage device 1258. The $V_{high}$ logic 1256 may be configured to instruct the D/A voltage device 1258 to selectively increment or decrement the high voltage value at the first resistor arrangement 1248 during a write operation. For example, the high voltage value may be adjusted when the data of the high test path 1274 falls outside of a predetermined range, ratio, set point, or other criteria when compared to corresponding data of the functional path 1222.

During a second write operation, a comparator 1224 may receive a data signal at a first input coupled to the data net 1206. A second input of the comparator 1224 may be coupled to a second resistor arrangement 1226. The second resistor arrangement 1226 may include resistors R3, R4, R5, and R6. The output of the comparator 1224 may comprise a low test path 1228 coupled to a $V_{low}$ logic 1230 configured to determine a low voltage value. The $V_{low}$ logic 1230 may be coupled to set impedance logic 1240. The $V_{low}$ logic 1230 may be configured to instruct the set impedance logic 1240 to pull down the impedance of the driver 1252. The impedance of the driver 1252 may be adjusted to train the memory controller 1204 during the write operation. For instance, impedance of the driver 1252 may be adjusted when the data of the low test path 1228 falls outside of a predetermined range, ratio, set point, or other criteria when compared to corresponding data of the functional path 1222.

A comparator 1260 may receive a data signal at a first input coupled to the data net 1206. A second input of the comparator 1260 may be coupled to the second resistor arrangement 1226. The output of the comparator 1260 may comprise a high test path 1276 coupled to a $V_{high}$ logic 1262 configured to determine a high voltage value. The $V_{high}$ logic 1262 may be coupled to set impedance logic 1264. The $V_{high}$ logic 1262 may be configured to instruct the set impedance logic 1264 to pull up the impedance of the driver 1252. The impedance of the driver 1252 may be adjusted to train the memory controller 1204 during the write operation. For example, impedance of the driver 1252 may be adjusted when the data of the high test path 1276 falls outside of a predetermined range, ratio, set point, or other criteria when compared to corresponding data of the functional path 1222.

As shown in FIG. 12, the memory controller 1204 may include a termination device 1242 and a termination device 1266. The memory device 1202 may include a termination device 1246 and a termination device 1268. The termination devices 1242, 1246, 1266, and 1268 may each be associated with a load impedance to match line impedance and reduce signal reflection along the data net 1206. The memory device 1202 may be coupled to a third resistor arrangement 1290. A voltage at the third resistor arrangement 1290 may affect impedances of the termination devices 1242, 1266 and the driver 1252. The memory controller 1204 may be coupled to a fourth resistor arrangement 1244. A voltage at the fourth resistor arrangement 1244 may affect impedances of the termination devices 1246, 1268 and the driver 1210.

FIG. 12 thus shows an embodiment of a system 1200 configured to train voltage values between the memory controller 1204 and the memory device 1202 using a combination of write operations. For instance, the impedance of the driver 1252 may be set using a first write operation, and the reference voltage of the first resistor arrangement 1248 may be set using a second write operation. The system 1200 may use both high and low voltage test paths in each write operation. The system 1200 may facilitate increased data accuracy, timing margins, and processing speed.

Figure 13:
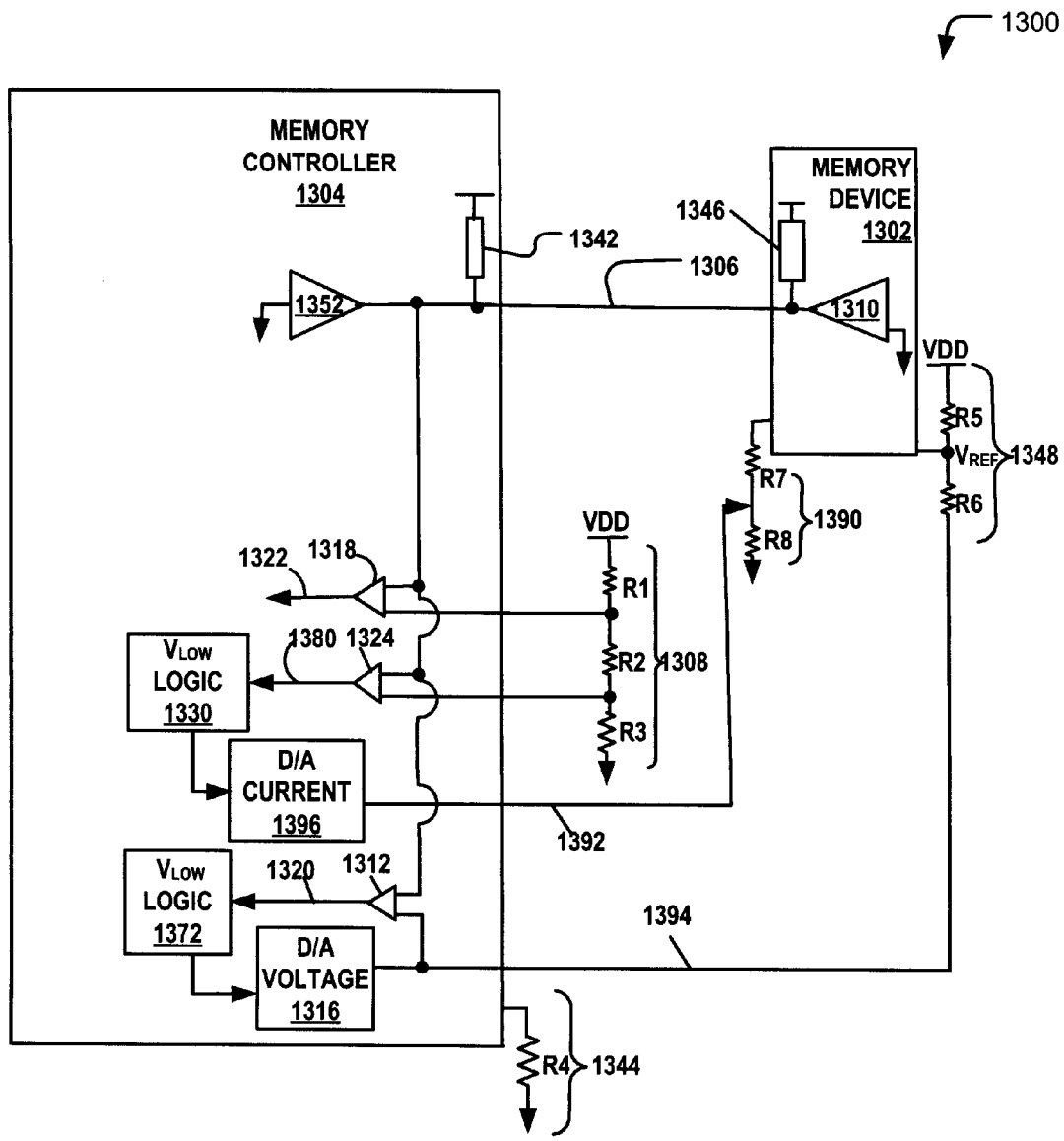
FIG. 13 is a block diagram of a second embodiment of a system configured to train a memory device and a memory controller using a combination of write operations.

FIG. 13 shows a second embodiment of a system 1300 configured to train a memory device 1302 and a memory controller 1304 using a combination of write operations. For example, during a first write operation, a voltage at a first resistor arrangement 1390 may be set to calibrate a termination device 1346 of the memory device 1302 according to a memory controller offset. A reference voltage ($V_{ref}$) associated with the memory device 1302 and a second resistor arrangement 1348 may be set during a second write operation.

The memory device 1302 may be coupled to the memory controller 1304 via a data net 1306. Training may include adjusting one more operating parameters of the memory device 1302. For instance, the training may include setting the reference voltage associated with the memory device 1302. In another example, an operating parameter may include the current offset for calibration of the termination device 1346.

The data net 1306 may be coupled to a first input of a comparator 1318. A third resistor arrangement 1308 may provide a reference voltage to a second input of the comparator 1318. The output of the comparator 1318 may comprise a functional path 1322 associated with a functional device (not shown). During a first write operation, a comparator 1324 may receive a data signal at a first input coupled to the data net 1306. A second input of the comparator 1324 may be coupled to a low voltage portion of the third resistor arrangement 1308. The third resistor arrangement 1308 may include multiple resistors R1, R2, and R3. The output of the comparator 1324 may comprise a low test path 1380 coupled to a $V_{low}$ logic 1330 configured to determine a low voltage value. The $V_{low}$ logic 1330 may be coupled to a D/A current device 1396. The $V_{low}$ logic 1330 may be configured to instruct a D/A current device 1396 to selectively increment or decrement a current value at the first resistor arrangement 1390 during the write operation. For example, the current may be adjusted according to an offset associated with the memory controller 1304. The offset may be determined when the data of the low test path 1380 falls outside of a predetermined range, ratio, set point, or other criteria when compared to corresponding data of the functional path 1322. When the adjusted current may be applied at the second resistor arrangement 1390, the termination device 1346 may be calibrated. The voltage on the data net 1306 may be set via the termination device 1346 according to the current applied to the third resistor arrangement 1308.

During a second write operation, a comparator 1312 may receive a data signal at a first input coupled to the data net 1306. A second input of the comparator 1312 may be coupled to a low voltage portion of the second resistor arrangement 1348. The second resistor arrangement 1348 may include multiple resistors R5, R6 and may provide the reference voltage to the memory device 1302. The output of the comparator 1312 may comprise a low test path 1320 coupled to a $V_{low}$ logic 1372 configured to determine a low voltage value. The $V_{low}$ logic 1372 may be coupled to a D/A voltage device 1316. The $V_{low}$ logic 1372 may be configured to instruct the D/A voltage device 1316 to selectively increment or decrement the low voltage value at the second resistor arrangement 1358 during a write operation. For instance, the low voltage value may be adjusted when the data of the low test path 1320 falls outside of a predetermined range, ratio, set point, or other criteria when compared to corresponding data of the functional path 1322.

As shown in FIG. 13, the memory controller 1304 may be coupled to a fourth resistor arrangement 1344 that includes a resistor R4. A voltage at the fourth resistor arrangement 1344 may affect impedances of a termination device 1342 and the driver 1352. The memory device 1302 may include the termination device 1346. The termination devices 1342, 1346 may each be associated with a load impedance to match line impedance and reduce signal reflection along the data net 1306.

The system 1300 may train voltage values between the memory controller 1304 and the memory device 1302 using a combination of write operations. For example, the current offset affecting the calibration of the termination device 1346 may be set according to a memory controller offset using a first write operation. The reference voltage associated with the memory device 1302 may be set using a second write operation. The system 1300 may use low voltage test paths in each write operation.

Figure 14:
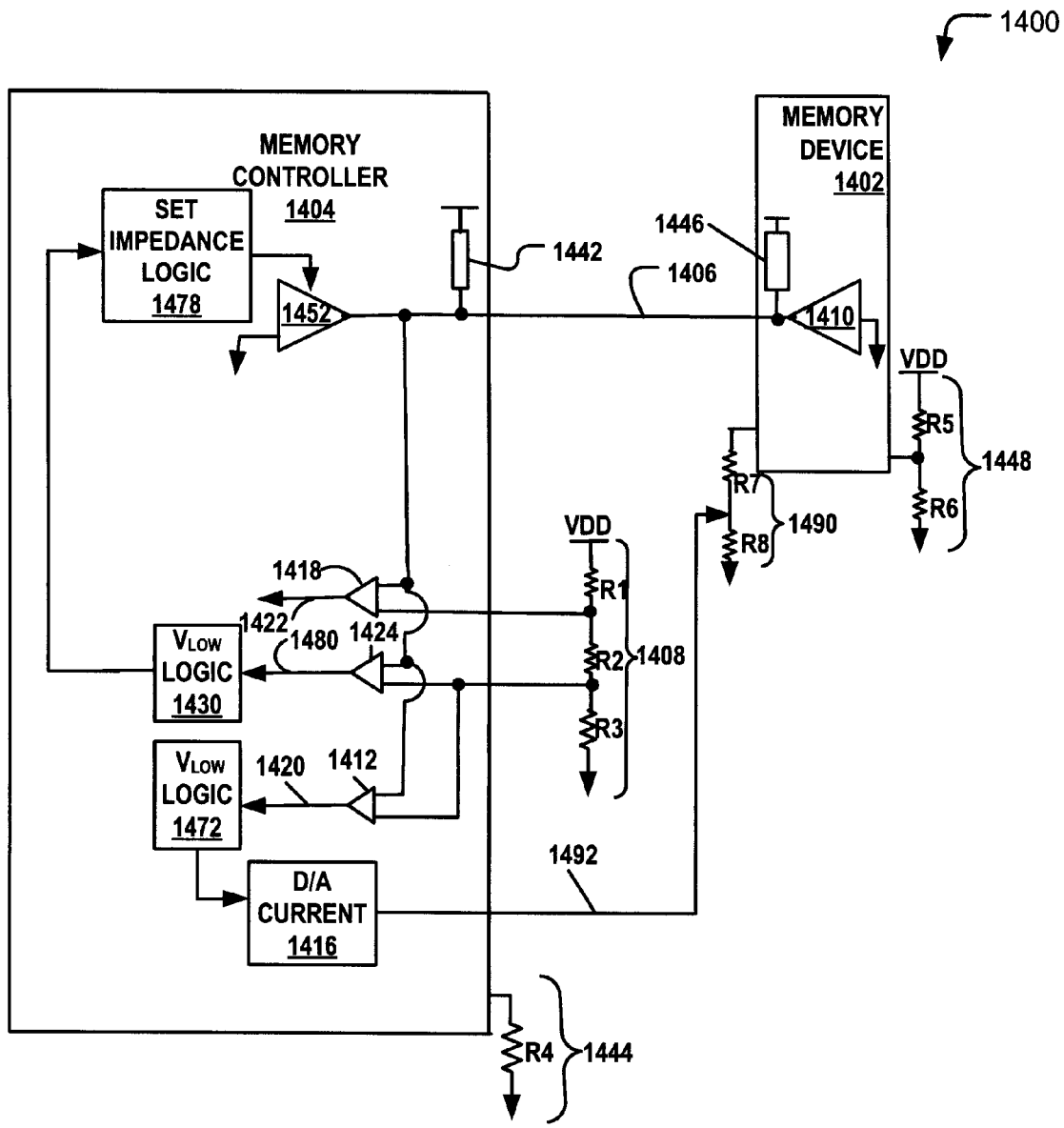
FIG. 14 is a block diagram of a third embodiment of a system configured to train a memory device and a memory controller using a combination of write operations.

FIG. 14 shows a third embodiment of a system 1400 configured to train a memory device 1402 and a memory controller 1404 using a combination of write operations. For instance, during a first write operation, a voltage at a first resistor arrangement 1490 may be set to calibrate a termination device 1146 of the memory device 1402 with an offset from the memory controller 1404. An impedance of a driver 1452 of the memory controller 1404 may be set using a second write operation.

The memory device 1402 may be coupled to the memory controller 1404 via a data net 1406. Training may include adjusting one more operating parameters of at least one of the memory device 10402 and the memory controller 1404. For example, the training may include setting an impedance at the driver 1452. In another example, an operating parameter may include a voltage at the memory device 1402 and associated with an offset of the termination device 1446.

The data net 1406 may couple the driver 1410 of the memory device 1402 to an input port of a comparator 1424 of the memory controller 1404. A second input of the comparator 1424 may be coupled to a second resistor arrangement 1408. The second resistor arrangement 1408 may include multiple resistors R1, R2, and R3. The second resistor arrangement 1408 may provide a low voltage value to the second input of the comparator 1424. The output of the comparator 1424 may comprise a low test path 1480 coupled to a $V_{low}$ logic 1430 configured to determine a low voltage value. The $V_{low}$ logic 1430 may be coupled to set impedance logic 1478. The set impedance logic 1478 may be configured to affect the impedance at the driver 1452.

The data net 1406 may additionally be coupled to a first input of a comparator 1418. The second resistor arrangement 1408 may provide a reference voltage to a second input of the comparator 1418. The output of the comparator 1418 may comprise a functional path 1422 associated with a functional device (not shown). During a write operation, the data of the functional path 1422 may be compared to the data of the low test path 1480. Results of the comparison may be used to adjust or otherwise set the impedance at the driver 1452. For instance, the correctness of the low test path data may be determined based on data of the functional path 1422. A percentage of the instances when correct data (or incorrect data) is read may be determined by comparing the test data with the functional data. A predetermined range, ratio, set point, or other criteria may be specified, as described herein.

During a write operation, a comparator 1412 may receive a data signal at a first input coupled to the data net 1406. A second input of the comparator 1412 may be coupled to a low voltage portion of the second resistor arrangement 1408. The output of the comparator 1412 may comprise a low test path 1420 coupled to a $V_{low}$ logic 1472 configured to determine a low voltage value. The $V_{low}$ logic 1472 may be coupled to a D/A current device 1416. The $V_{high}$ logic 1472 may be configured to instruct the D/A current device 1416 to selectively increment or decrement a current value at the first resistor arrangement 1490 during a write operation. For example, the current may be adjusted according to an offset associated with the memory controller 1404. The offset may be determined when the data of the low test path 1420 falls outside of a predetermined range, ratio, set point, or other criteria when compared to corresponding data of the functional path 1422. The first resistor arrangement 1490 may include multiple resistors R7, R8. When the current is applied at the first resistor arrangement 1490, the termination device 1446 may be calibrated. The voltage on the data net 1406 may be set via the termination device 1446 according to the current applied to the first resistor arrangement 1490.

As shown in FIG. 14, the memory controller 1404 may be coupled to a third resistor arrangement 1444 that includes a resistor R4. A voltage at the third resistor arrangement 1444 may affect impedances of a termination device 1442 and the driver 1452. The memory device 1402 may be coupled to a fourth resistor arrangement 1448 that includes resistors R5, R6. The fourth resistor arrangement 1448 may be configured to provide a reference voltage to the memory device 1402. The memory device 1402 may further include a termination device 1446. The termination devices 1442, 1446 may each be associated with a load impedance to match line impedance and reduce signal reflection along the data net 1406.

The system 1400 may train voltage values between the memory controller 1404 and the memory device 1402 using a combination of write operations. For instance, the voltage value affecting the termination device 1446 of the memory device 1402 may be set according to a memory controller offset. The impedance of the driver 1452 of the memory controller 1404 may be set using a write operation. The system 1400 may use low voltage test paths in each write operation.

Figure 15:
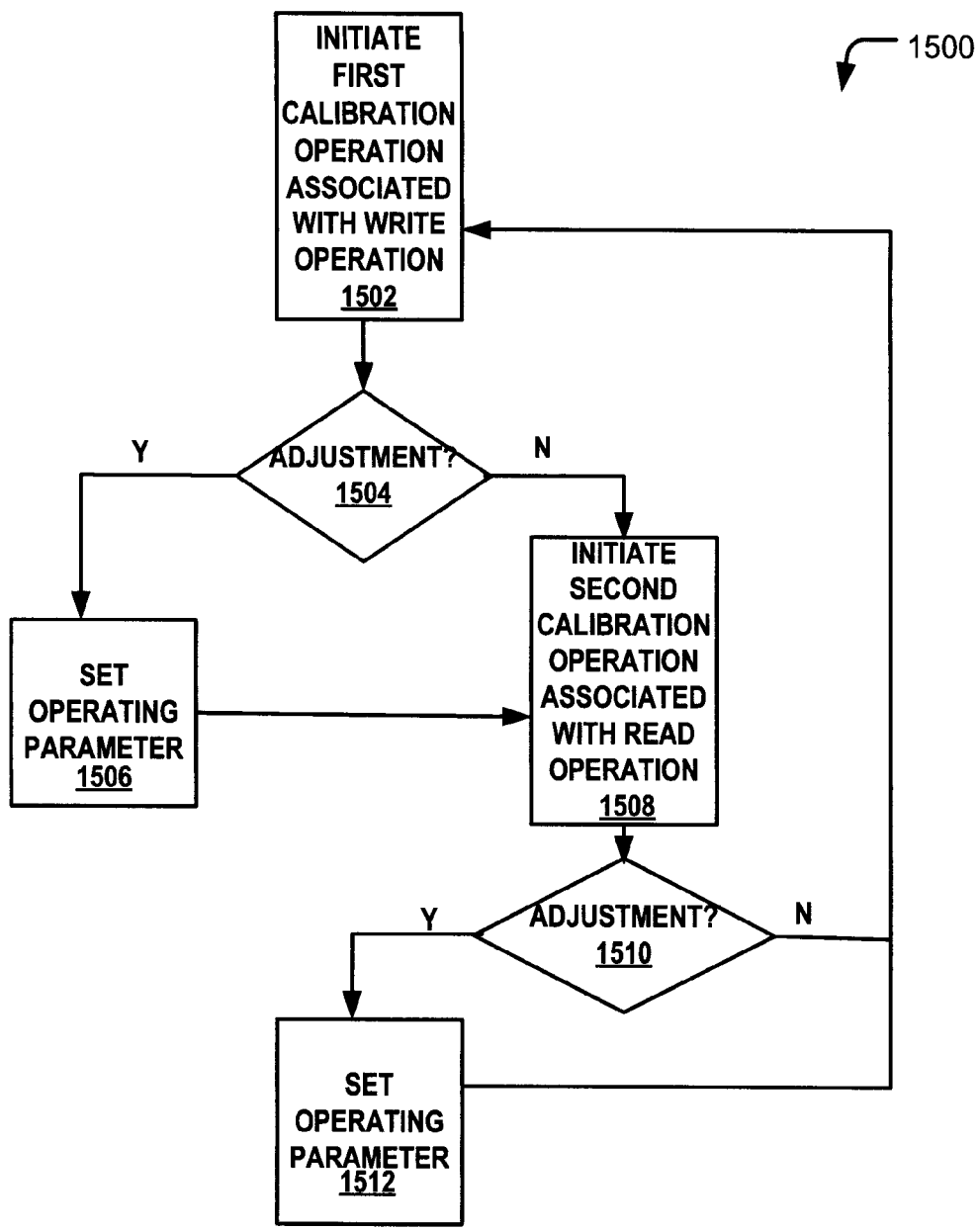
FIG. 15 is a flow diagram of an embodiment of a method to train a memory controller and a memory device using a combination of a read operation and a write operation.

FIG. 15 shows an embodiment of a method 1500 of calibrating a memory device and a memory controller using a combination of a read operation and a write operation. The method may be executed by a memory bus, such as that shown in each of FIGS. 1-8. A result of one or more of the read and write operations may result in updating or otherwise setting an operating parameter, such as an impedance value or voltage value associated with at least one of the memory device and the memory controller.

At 1502, a first calibration operation associated with a write operation may be initiated. For example, the driver 152 of the memory controller 104 of FIG. 1 may write a zero to the memory device 102. Test data at the memory controller 104 may be evaluated during the calibration operation. For instance, data of the test path 128 may be compared to the data of the functional path 122.

Based upon the comparison, the system may determine if a first operating parameter may be adjusted, 1504. For example, the correctness of the test path data may be determined based on data of the functional path 122. A percentage of the instances when correct data (or incorrect data) is read in the test data path 128 may be determined by comparing the test data with the functional data. For instance, the data of the functional path 122 may be used to determine if a one or a zero of the test path 128 correctly corresponds to a one or zero of the functional path. At a point when the incorrect data of the test path 128 switches (i.e., from a zero to a one, or from a one to a zero), the voltage value may be set correctly. A predetermined range, ratio, set point, or other criteria may be specified.

When an adjustment is indicated, the first operating parameter may be set, at 1506. Setting the first operating parameter may include setting an impedance value of a driver of the memory controller. Setting the first operating parameter may alternatively include setting a reference voltage associated with the memory device. For example, the reference voltage may be communicated using a resistor arrangement coupled to the memory device. Setting the first operating parameter may further include setting an impedance of a termination device of the memory device. The impedance may be set according to a determined voltage offset that is associated with the memory controller. The voltage value may be applied to a resistor arrangement coupled to the memory device.

At 1508, a calibration operation associated with a read operation may be initiated. For instance, the memory controller 104 of FIG. 1 may read a zero placed on the data net 106 by the driver 110 of the memory device 102. Test data at the memory controller 104 may be evaluated during the calibration operation. For example, data of the test path 120 may be compared to the data of the functional path 122.

Based upon the comparison, the system may determine if a second operating parameter may be adjusted, at 1510. For instance, the correctness of the test path data may be determined based on data of the functional path 122 and a predetermined range, ratio, set point, or other criteria.

When an adjustment is indicated, the second operating parameter may be set, at 1512. For example, setting the second operating parameter may include setting a reference voltage associated with the memory controller. The reference voltage may be communicated using a resistor arrangement coupled to the memory controller. Setting the second operating parameter may alternatively include setting an impedance value of a termination device of the memory controller. Setting the second operating parameter may also include setting a voltage value affecting a driver of the memory device. The voltage value may be set according to a determined voltage offset that is associated with the memory controller. The voltage value may be applied to a resistor arrangement coupled to the memory device.

Figure 16:
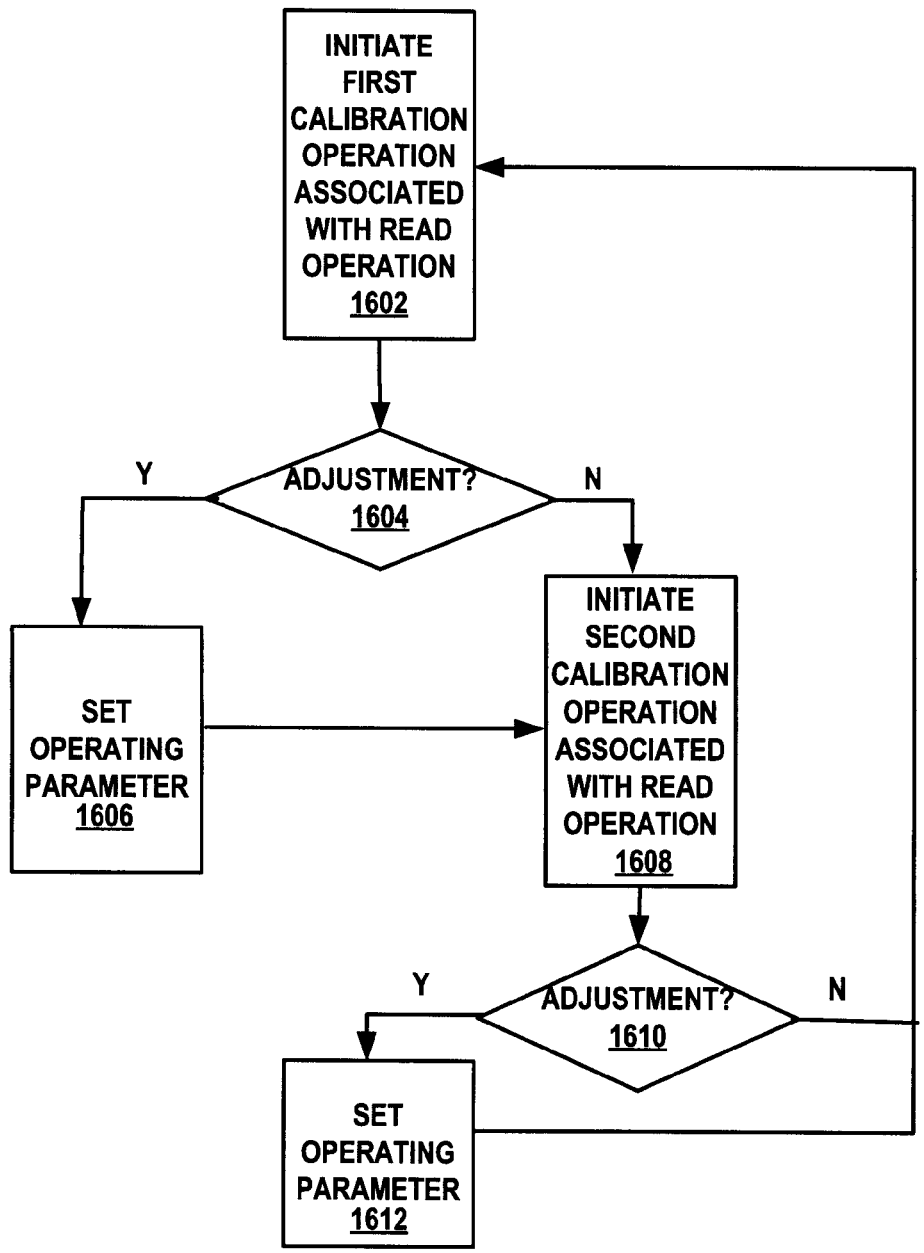
FIG. 16 is a flow diagram of an embodiment of a method to train a memory controller and a memory device using a combination of read operations.

FIG. 16 shows an embodiment of a method 1600 of calibrating a memory device and a memory controller using a combination of read operations. The method may be executed by a memory bus, such as that shown in each of FIGS. 9-11. A result of one or more of the read operations may result in updating or otherwise setting an operating parameter, such as an impedance value or voltage value associated with one or more of the memory device and the memory controller.

At 1602, a calibration operation associated with a first read operation may be initiated. For example, the memory controller 1004 of FIG. 10 may read a zero from the driver 1010 of the memory device 102. Test data at the memory controller 1004 may be evaluated during the calibration operation. For instance, data of the test path 1080 may be compared to the data of the functional path 1022.

Based on the comparison, the system may determine if a first operating parameter may be adjusted, 1604. For example, the correctness of the test path data may be determined based on data of the functional path 1022. A percentage of the instances when correct data (or incorrect data) is read in the test data path 1080 may be determined by comparing the test data with the functional data based on a predetermined range, ratio, set point, or other criteria.

When an adjustment is indicated, the first operating parameter may be set, at 1606. For example, setting the operating parameter may include setting an impedance value of a termination device of the memory device. Setting the operating parameter may alternatively include setting a voltage value affecting a driver of the memory device. The voltage value may be set according to a determined voltage offset that is associated with the memory controller. The voltage value may be applied to a resistor arrangement coupled to the memory device.

At 1608, a calibration operation associated with a second read operation may be initiated. For instance, the memory controller 1004 of FIG. 10 may read a zero placed on the data net 106 by the driver 1010 of the memory device 1002. Test data at the memory controller 1004 may be evaluated during the calibration operation. For example, data of the test path 1020 may be compared to the data of the functional path 1022.

Based on the comparison, the system may determine if a second operating parameter may be adjusted, at 1610. For instance, the correctness of the test path data may be determined based on data of the functional path 1022 and a predetermined range, ratio, set point, or other criteria.

When an adjustment is indicated, the second operating parameter may be set, at 1612. For example, setting the second operating parameter may include setting a reference voltage associated with the memory controller. For instance, the reference voltage may be communicated using a resistor arrangement coupled to the memory controller. Setting the operating parameter may alternatively include setting an impedance value of a termination device of the memory controller.

Figure 17:
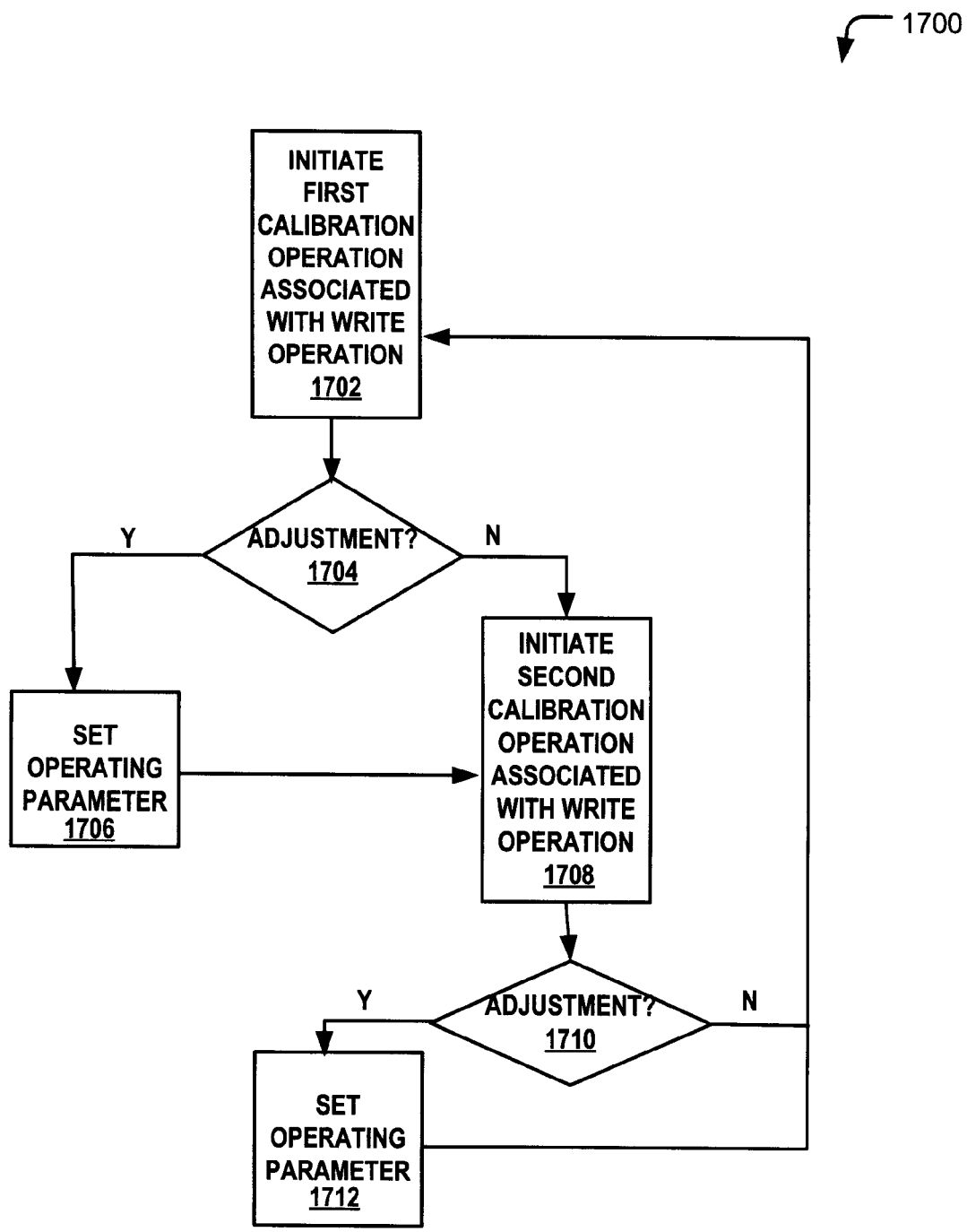
FIG. 17 is a flow diagram of an embodiment of a method to train a memory controller and a memory device using a combination of write operations.

FIG. 17 shows an embodiment of a method 1700 of calibrating a memory device and a memory controller using a combination of write operations. The method may be executed by a memory bus, such as that shown in each of FIGS. 12-14. A result of one or more of the write operations may result in updating or otherwise setting an operating parameter, such as an impedance value or voltage value associated with one or more of the memory device and the memory controller.

At 1702, a calibration operation associated with a write operation may be initiated. For example, the driver 1252 of the memory controller 1204 of FIG. 12 may write a zero to the memory device 102. Test data at the memory controller 1204 may be evaluated during the calibration operation. For instance, data of the test path 1228 may be compared to the data of the functional path 1222.

Based upon the comparison, the system may determine if a first operating parameter may be adjusted, at 1704. For example, the correctness of the test path data may be determined based on data of the functional path 1222. A percentage of the instances when correct data (or incorrect data) is read in the test data path 1228 may be determined by comparing the test data with the functional data based on a predetermined range, ratio, set point, or other criteria.

When an adjustment is indicated, the first operating parameter may be set, at 1706. For example, setting the operating parameter may include setting a reference voltage associated with the memory device. The reference voltage may be communicated using a resistor arrangement coupled to the memory device. Setting the operating parameter may also include setting an impedance of a termination device of the memory device. The impedance may be set according to a determined voltage offset that is associated with the memory controller. A voltage value may be applied to a resistor arrangement coupled to the memory device.

At 1708, a calibration operation associated with a second write operation may be initiated. For instance, the memory controller 1204 of FIG. 12 may write a one onto the data net 1206 to memory device 1002. Test data at the memory controller 1204 may be evaluated during the calibration operation. For example, data of the test path 1220 may be compared to the data of the functional path 1222.

Based upon the comparison, the system may determine if a second operating parameter may be adjusted, at 1710. For instance, the correctness of the test path data may be determined based on data of the functional path 1222 and a predetermined range, ratio, set point, or other criteria.

When an adjustment is indicated, the second operating parameter may be set, at 1712. For example, setting the second operating parameter may include setting an impedance value of a driver of the memory controller. Setting the operating parameter may alternatively include setting a reference voltage associated with the memory device. For instance, the reference voltage may be communicated using a resistor arrangement coupled to the memory device.

FIGS. 15-17 thus show embodiments of methods 1500, 1600, and 1700 of training a memory controller and a memory device using different combinations of read and/or write operations. The automatic adjustment of operating parameters may reduce impedance mismatches and yield improvements in timing margins. Data may be read and compared to known data at startup and during real time. System operation may remain uninterrupted while the operating parameters are selectively updated. The updates may increase system speed and accuracy.

Particular embodiments can take the form of an entirely hardware embodiment, an entirely software embodiment, or an embodiment containing both hardware and software elements. Further, embodiments may take the form of a computer program product accessible from a computer-usable or computer-readable medium providing program code for use by or in connection with a computer or any instruction execution system. For the purposes of this description, a computer-usable or computer readable medium can be any apparatus that can contain, store, or communicate the program for use by or in connection with the instruction execution system, apparatus, or device.

The medium can be an electronic, magnetic, optical, electromagnetic, infrared, or semiconductor system (or apparatus or device). Examples of a computer-readable medium include a semiconductor or solid state memory, magnetic tape, a removable computer diskette, a random access memory (RAM), a read-only memory (ROM), a rigid magnetic disk, and an optical disk. Examples of optical disks include compact disc—read only memory (CD-ROM), compact disc—read/write (CD-R/W) and DVD. A data processing system suitable for storing and/or executing program code will include at least one processor coupled directly or indirectly to memory elements through a system bus. The memory elements can include local memory employed during actual execution of the program code, bulk storage, and cache memories that provide temporary storage of at least some program code in order to reduce the number of times code must be retrieved from bulk storage during execution.

While the present invention has been illustrated by a description of various embodiments and while these embodiments have been described in considerable detail, it is not the intention of the Applicants to restrict, or any way limit the scope of the appended claims to such detail. For example, while numerous different combinations of operations are described herein, others are contemplated by the underlying principles of the invention. For instance, another write/read combination may set a reference voltage of a memory controller during a read operation (as shown in the read portion of FIG. 1) and may calibrate a termination device of a memory device during a write operation (as shown in the write portion of FIG. 6). As such, contemplated combinations are not limited to those shown in the exemplary embodiments.

In another example, calibration may be repeated as conditions change for maintenance of desired settings and performance. Unique settings may be saved for different conditions. As an example, a temperature change greater than a predetermined amount (e.g., twenty degrees Celsius) from the original or last calibration could initiate a calibration. Alternatively, the condition may initiate the retrieval of a previously stored set of calibration values associated with the new temperature. Other illustrative conditions may include the activation or deactivation of system components (e.g., another bus, an interface, or controller) that may impact the interface.

Further, while some embodiments of the invention are described specifically for a GDDR3 interface from a memory controller to a GDDR3 memory device, the system and method described may be applied to any number of system and sub-system electrical communication buses and generic interfaces. The invention in its broader aspects is therefore not limited to the specific details, representative apparatus, methods, and illustrative examples shown and described. Accordingly, departures may be made from such details without departing from the scope of Applicants' general inventive concept.

The invention claimed is:

1. A method of setting an operating parameter associated with a communication bus that includes a memory controller coupled to a memory device, the method comprising:
    performing a first calibration operation associated with first data written from the memory controller to the memory device using at least one of a low voltage test path that includes a first digital-to-analog voltage device coupled to a $V_{low}$ logic in the memory controller or a high voltage test path that includes a second digital-to-analog voltage device coupled to a $V_{high}$ logic in the memory controller;
    performing a second calibration operation associated with second data read at the memory controller from the memory device using at least one of a second low voltage test path coupled to a second $V_{low}$ logic in the memory controller or a second high voltage test path coupled to a second $V_{high}$ logic in the memory controller; and
    setting an operating parameter based on a result of at least one of the first calibration operation or the second calibration operation in at least one of the memory device or the memory controller.

2. The method of claim 1, wherein setting the operating parameter further includes setting a reference voltage associated with the memory controller during at least one of the first calibration operation or the second calibration operation.

3. The method of claim 1, wherein setting the operating parameter further includes setting an impedance of a termination device associated with the memory controller during at least one of the first calibration operation or the second calibration operation.

4. The method of claim 1, wherein setting the operating parameter further includes setting a voltage value affecting a driver of the memory device during at least one of the first calibration operation or the second calibration operation.

5. The method of claim 1, wherein setting the operating parameter further includes setting an impedance value of a driver of the memory controller during at least one of the first calibration operation or the second calibration operation.

6. The method of claim 1, wherein setting the operating parameter further includes setting a reference voltage associated with the memory device during at least one of the first calibration operation or the second calibration operation.

7. The method of claim 1, wherein setting the operating parameter further includes setting an impedance of a termination device of the memory device during at least one of the first calibration operation or the second calibration operation.

8. The method of claim 1, wherein at least one of the first calibration operation or the second calibration operation includes comparing functional data to test data at the memory controller, wherein performing the second calibration operation uses the second low voltage test path when the first calibration is performed using the low voltage test path, and wherein performing the second calibration operation uses the second high voltage test path when the first calibration operation is performed using the high voltage test path.

9. The method of claim 1, further comprising performing at least one of the first calibration operation or the second calibration operation during system startup, wherein the second low voltage test path includes a third digital-to-analog voltage device or a first digital-to-analog current device.

10. The method of claim 1, further comprising performing at least one of the first calibration operation or the second calibration operation using functional data during system operation, wherein the second high voltage test path includes a fourth digital-to-analog voltage device or a second digital-to-analog current device.

11. A system comprising:
a memory controller coupled to a memory device, comprising:
at least one of a low voltage test path that includes a first digital-to-analog voltage device coupled to a $V_{low}$ logic in the memory controller or a high voltage test path that includes a second digital-to-analog voltage device coupled to a $V_{high}$ logic in the memory controller to perform a first calibration operation associated with first data written from the memory controller to the memory device; and
at least one of a second low voltage test path coupled to a second $V_{low}$ logic in the memory controller or a second high voltage test path coupled to a second $V_{high}$ logic in the memory controller to perform a second calibration operation associated with second data read at the memory controller from the memory device;
wherein the memory controller sets an operating parameter based on a result of at least one of the first calibration operation or the second calibration operation in at least one of the memory device or the memory controller.

12. The system of claim 11, wherein the memory controller sets the operating parameter by setting a reference voltage associated with the memory controller during at least one of the first calibration operation or the second calibration operation.

13. The system of claim 11, wherein the memory controller sets the operating parameter by setting an impedance of a termination device associated with the memory controller during at least one of the first calibration operation or the second calibration operation.

14. The system of claim 11, wherein setting-the memory controller sets the operating parameter by setting a voltage value affecting a driver of the memory device during at least one of the first calibration operation or the second calibration operation.

15. The system of claim 11, wherein the memory controller sets the operating parameter by setting an impedance value of a driver of the memory controller during at least one of the first calibration operation or the second calibration operation.

16. The system of claim 11, wherein the memory controller sets the operating parameter by setting a reference voltage associated with the memory device during at least one of the first calibration operation or the second calibration operation.

17. The system of claim 11, wherein the memory controller sets the operating parameter by setting an impedance of a termination device of the memory device during at least one of the first calibration operation or the second calibration operation.

18. The system of claim 11, wherein at least one of the first calibration operation or the second calibration operation includes comparing functional data to test data at the memory controller.

19. The system of claim 11, wherein at least one of the first calibration operation or the second calibration operation is performed during system startup.

20. The system of claim 11, wherein at least one of the first calibration operation or the second calibration operation is performed using functional data during system operation.

* * * * *